US012621924B2

(12) United States Patent
Nelson et al.

(10) Patent No.: US 12,621,924 B2
(45) Date of Patent: May 5, 2026

(54) HEAT SINK COMPONENT TERMINATIONS

(71) Applicant: KYOCERA AVX Components Corporation, Fountain Inn, SC (US)

(72) Inventors: Cory Nelson, Simpsonville, SC (US); Marianne Berolini, Greer, SC (US); Ronald Demcko, Raleigh, NC (US)

(73) Assignee: KYOCERA AVX Components Corporation, Foutain Inn, SC (US)

( * ) Notice: Subject to any disclaimer, the term of this patent is extended or adjusted under 35 U.S.C. 154(b) by 274 days.

(21) Appl. No.: 18/350,782

(22) Filed: Jul. 12, 2023

(65) Prior Publication Data

US 2024/0032185 A1      Jan. 25, 2024

Related U.S. Application Data

(60) Provisional application No. 63/390,655, filed on Jul. 20, 2022.

(51) Int. Cl.
*H05K 1/02*          (2006.01)

(52) U.S. Cl.
CPC ....... *H05K 1/021* (2013.01); *H05K 2201/066* (2013.01); *H05K 2201/10537* (2013.01); *H05K 2201/10757* (2013.01)

(58) Field of Classification Search
CPC ........... H05K 2201/066; H05K 1/0209; H05K 1/0204; H05K 2201/10537; H05K 2201/10757
See application file for complete search history.

(56) References Cited

U.S. PATENT DOCUMENTS

| | | | |
|---|---|---|---|
| 9,750,160 | B2 | 8/2017 | Short, Jr. et al. |
| 10,660,238 | B2 | 5/2020 | Durgin |
| 2005/0257532 | A1 | 11/2005 | Ikeda et al. |
| 2010/0269517 | A1 | 10/2010 | Ikeda et al. |
| 2014/0345829 | A1 | 11/2014 | Kang et al. |
| 2023/0076503 | A1 | 3/2023 | Berolini et al. |

FOREIGN PATENT DOCUMENTS

| | | | | |
|---|---|---|---|---|
| JP | 2002373955 | A | * 12/2002 | ............. H01L 23/12 |
| JP | 2005106381 | A | 4/2005 | |
| JP | 2015084609 | A | 4/2015 | |

OTHER PUBLICATIONS

PDF and machine translation of JP2002373955 (Year: 2002).*
International Search Report and Written Opinion for PCT/US2023/027512 dated Nov. 1, 2023, 9 pages.

* cited by examiner

*Primary Examiner* — Jeremy C Norris
(74) *Attorney, Agent, or Firm* — Dority & Manning, P.A.

(57)          ABSTRACT

A heat sink component can include a body including a thermally conductive material that is electrically non-conductive. At least one first terminal can be formed over a surface of the body. At least one second terminal can be formed over the surface of the body. A terminal spacing distance can be defined along the surface between the first terminal and the second terminal. A ratio of a length of the surface to the terminal spacing distance can be greater than about 10. Additionally or alternatively, a ratio of the area of the at least one body surface to the total terminal area can be less than 1.2. A component assembly can include a device having a plurality of terminals exposed on a top surface, and the heat source terminal and the heat sink terminal of the heat sink component can be connected with respective terminals of the device.

25 Claims, 26 Drawing Sheets

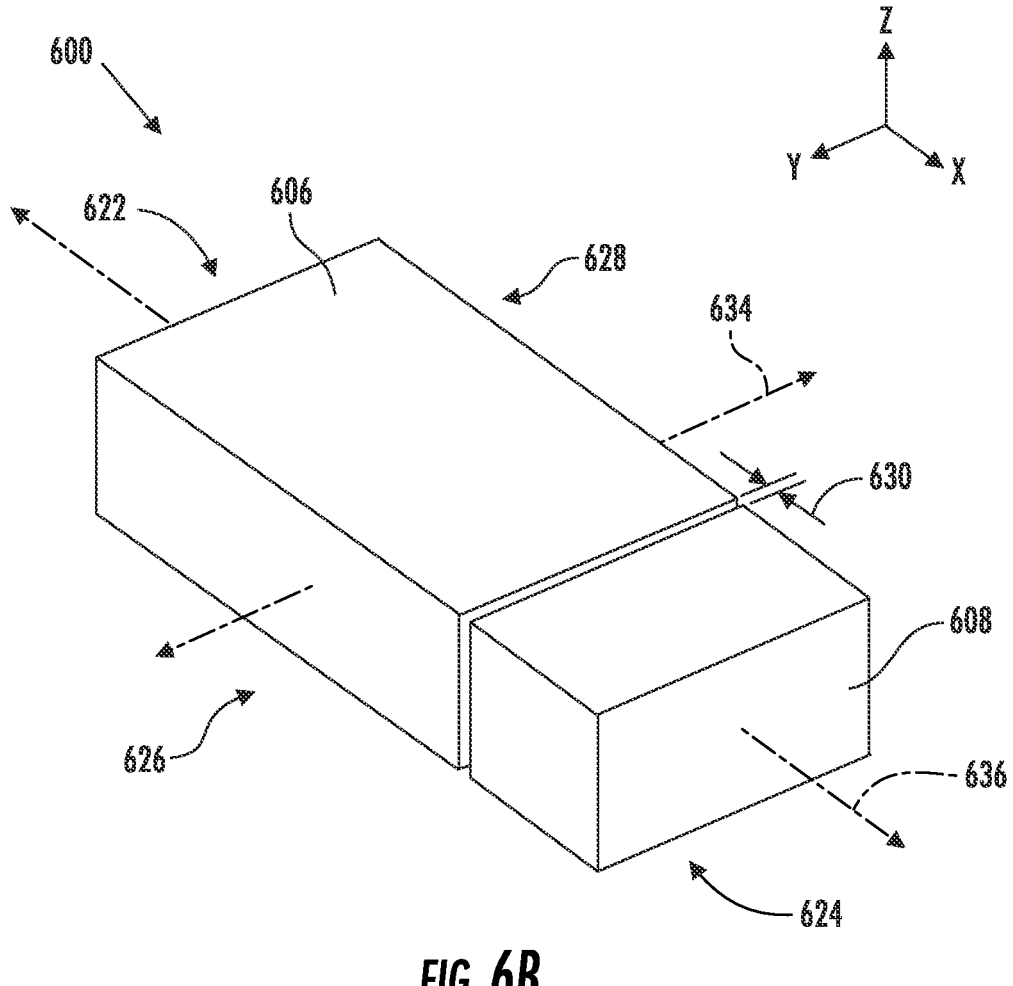
FIG. 6B

1300

1302

PROVIDE BODY HAVING PLURALITY OF BODY SURFACES

1304

FORM HEAT SOURCE TERMINAL HAVING HEAT SOURCE TERMINAL
AREA OVER AT LEAST ONE BODY SURFACE HAVING AN AREA

1306

FORM HEAT SINK TERMINAL HAVING HEAT SINK TERMINAL AREA OVER THE AT
LEAST ONE BODY SURFACE, WHEREIN RATIO OF AREA OF THE AT LEAST
ONE BODY SURFACE TO TOTAL TERMINAL AREA IS LESS THAN 1.2

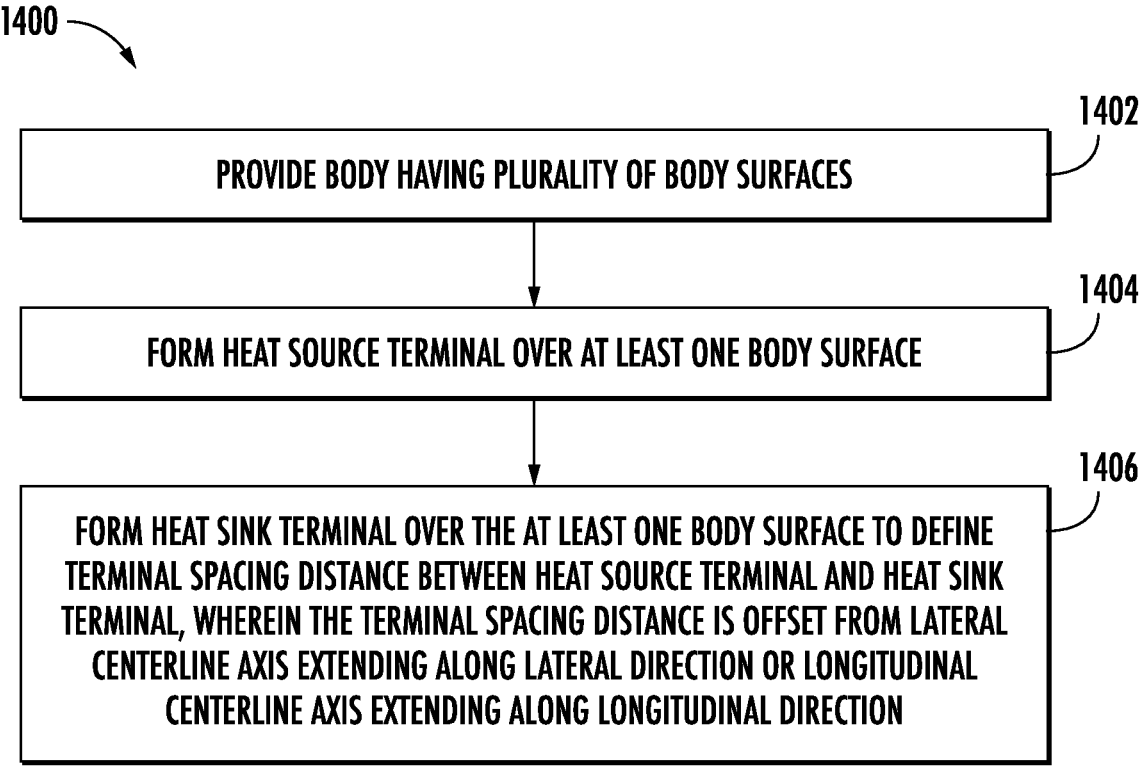

1400

1402
PROVIDE BODY HAVING PLURALITY OF BODY SURFACES

1404
FORM HEAT SOURCE TERMINAL OVER AT LEAST ONE BODY SURFACE

1406
FORM HEAT SINK TERMINAL OVER THE AT LEAST ONE BODY SURFACE TO DEFINE TERMINAL SPACING DISTANCE BETWEEN HEAT SOURCE TERMINAL AND HEAT SINK TERMINAL, WHEREIN THE TERMINAL SPACING DISTANCE IS OFFSET FROM LATERAL CENTERLINE AXIS EXTENDING ALONG LATERAL DIRECTION OR LONGITUDINAL CENTERLINE AXIS EXTENDING ALONG LONGITUDINAL DIRECTION

PROVIDE BODY HAVING PLURALITY OF BODY SURFACES

1504

FORM HEAT SOURCE TERMINAL OVER AT LEAST ONE BODY SURFACE

1506

FORM HEAT SINK TERMINAL OVER THE AT LEAST ONE BODY SURFACE
THAT INCLUDES A FLANGE THAT EXTENDS BEYOND THE BODY

1600

1602

PROVIDE BODY HAVING PLURALITY OF BODY SURFACES

1604

FORM HEAT SOURCE TERMINAL OVER AT LEAST ONE BODY SURFACE
THAT INCLUDES A PAIR OF BENDABLE LEADS

1606

FORM HEAT SINK TERMINAL OVER THE AT LEAST ONE BODY SURFACE

1700

1702

PROVIDE BODY HAVING PLURALITY OF BODY SURFACES

1704

FORM HEAT SOURCE TERMINAL OVER AT LEAST ONE BODY SURFACE

1706

FORM HEAT SINK TERMINAL OVER THE AT LEAST ONE BODY
SURFACE THAT INCLUDES A PAIR OF BENDABLE LEADS

1800

1802
PROVIDE BODY HAVING PLURALITY OF BODY SURFACES
THAT INCLUDE TOP SURFACE AND BOTTOM SURFACE

1804
FORM HEAT SOURCE TERMINAL OVER TOP SURFACE OR
BOTTOM SURFACE THAT INCLUDES A PAIR OF LEADS

1806
FORM HEAT SINK TERMINAL OVER ENTIRETY OF OTHER
OF TOP SURFACE OR BOTTOM SURFACE

1900

1902
PROVIDE BODY HAVING PLURALITY OF BODY SURFACES THAT INCLUDE TOP SURFACE AND BOTTOM SURFACE

1904
FORM HEAT SOURCE TERMINAL OVER TOP SURFACE OR BOTTOM SURFACE THAT INCLUDES A PAIR OF WIRE BOND PADS

1906
FORM HEAT SINK TERMINAL OVER ENTIRETY OF OTHER OF TOP SURFACE OR BOTTOM SURFACE

HEAT SINK COMPONENT TERMINATIONS

RELATED APPLICATION

The present application is based upon and claims priority to U.S. Provisional Patent Application Ser. No. 63/390,655, having a filing date of Jul. 20, 2022, which is incorporated herein by reference.

BACKGROUND OF THE INVENTION

Electrical circuits, such as power amplifier circuits, generate heat during normal operation. Heat build-up may undesirably increase the temperature of the various components of the electrical circuit. If this heat is not sufficiently managed, for example by dissipation to a heat sink, the electrical device may overheat, resulting in damage to the electrical component.

SUMMARY OF THE INVENTION

In accordance with one embodiment of the present invention, a heat sink component can include a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one body surface of the plurality of body surfaces. A heat sink terminal can be formed over the at least one body surface of the plurality of body surfaces. A terminal spacing distance can be defined along the at least one body surface between the heat source terminal and the heat sink terminal. A ratio of a length of the at least one body surface to the terminal spacing distance can be greater than about 10.

In accordance with another embodiment of the present invention, a heat sink component can include a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one body surface of the plurality of body surfaces. A heat sink terminal can be formed over the at least one body surface of the plurality of body surfaces. The at least one body surface can have an area defined by a product of a length of the at least one body surface and a width of the at least one body surface. The heat source terminal can have a heat source terminal area defined by a product of a heat source terminal length and a heat source terminal width. The heat sink terminal can have a heat sink terminal area defined by a product of a heat sink terminal length and a heat sink terminal width. A sum of the heat source terminal area and the heat sink terminal area can be a total terminal area. A ratio of the area of the at least one body surface to the total terminal area can be less than 1.2.

In accordance with another embodiment of the present invention, a heat sink component can include a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one body surface of the plurality of body surfaces. A heat sink terminal can be formed over the at least one body surface of the plurality of body surfaces. A terminal spacing distance can be defined along the at least one body surface between the heat source terminal and the heat sink terminal. The terminal spacing distance can be offset from a lateral centerline axis extending along the lateral direction or a longitudinal centerline axis extending along the longitudinal direction.

In accordance with yet another embodiment of the present invention, a heat sink component can include a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one of the top surface, the bottom surface, the first end surface, the second end surface, the first side surface, or the second side surface. A heat sink terminal can be formed over the at least one of the top surface, the bottom surface, the first end surface, the second end surface, the first side surface, or the second side surface. The heat sink terminal can include a flange that extends beyond the body.

In accordance with still another embodiment of the present invention, a heat sink component can include a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one of the top surface, the bottom surface, the first end surface, the second end surface, the first side surface, or the second side surface. A heat sink terminal can be formed over the at least one of the top surface, the bottom surface, the first end surface, the second end surface, the first side surface, or the second side surface. The heat source terminal can include a pair of bendable leads.

In accordance with another embodiment of the present invention, a heat sink component can include a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over at least one of the top surface, the bottom surface, the first end surface, the second end surface, the first side surface, or the second side surface. A heat sink terminal can be formed over the at least one of the top surface, the bottom surface, the first end surface, the second end surface, the first side surface, or the second side surface. The heat sink terminal can include a pair of bendable leads.

In accordance with a further embodiment of the present invention, a heat sink component can include a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over the top surface or the bottom surface. A heat sink terminal can be formed over the entirety of the other of the top surface or the bottom surface. The heat source terminal can include a pair of leads.

In accordance with still another embodiment of the present invention, a heat sink component can include a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. A heat source terminal can be formed over the top surface or the bottom surface. A heat sink terminal can be formed over the entirety of the other of the top surface or the bottom surface. The heat source terminal can include a pair of wire bond pads.

In accordance with yet another embodiment of the present invention, a component assembly can include a device comprising a top surface and a plurality of terminals exposed on the top surface. The component assembly can also include the heat sink component mounted to the device, such as a heat sink component described in any one of the various embodiments discussed herein. The heat source terminal can be connected with one of the plurality of terminals of the device, and the heat sink terminal can be connected with another of the plurality of terminals of the device.

In accordance with another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. The method can further include forming a heat source terminal over at least one body surface of the plurality of body surfaces and forming a heat sink terminal over the at least one body surface of the plurality of body surfaces to define a terminal spacing distance along the at least one body surface between the heat source terminal and the heat sink terminal. A ratio of a length of the at least one body surface to the terminal spacing distance can be greater than about 10.

In accordance with another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. The method can further include forming a heat source terminal over at least one body surface of the plurality of body surfaces and forming a heat sink terminal over the at least one body surface of the plurality of body surfaces. The at least one body surface can have an area defined by a product of a length of the at least one body surface and a width of the at least one body surface. The heat source terminal can have a heat source terminal area defined by a product of a heat source terminal length and a heat source terminal width. The heat sink terminal can have a heat sink terminal area defined by a product of a heat sink terminal length and a heat sink terminal width. A sum of the heat source terminal area and the heat sink terminal area can be a total terminal area. A ratio of the area of the at least one body surface to the total terminal area can be less than 1.2.

In accordance with yet another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction. The method can also include forming a heat source terminal over at least one body surface of the plurality of body surfaces and forming a heat sink terminal over the at least one body surface of the plurality of body surfaces to define a terminal spacing distance along the at least one body surface between the heat source terminal and the heat sink terminal. The terminal spacing distance can be offset from a lateral centerline axis extending along the lateral direction or a longitudinal centerline axis extending along the longitudinal direction.

In accordance with still another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. The method can further include forming a heat source terminal over at least one of the top surface, the bottom surface, the first end surface, the second end surface, the first side surface, or the second side surface. The method can further include forming a heat sink terminal over the at least one of the top surface, the bottom surface, the first end surface, the second end surface, the first side surface, or the second side surface. The heat sink terminal can include a flange that extends beyond the body.

In accordance with another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. The method can also include forming a heat source terminal over at least one of the top surface, the bottom surface, the first end surface, the second end surface, the first side surface, or the second side surface. The method can further include forming a heat sink terminal over the at least one of the top surface, the bottom surface, the first end surface, the second end surface, the first side surface, or the second side surface. The heat source terminal can include a pair of bendable leads.

In accordance with another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. The method can also include forming a heat source terminal over at least one of the top surface, the bottom surface, the first end surface, the second end surface, the first side surface, or the second side surface. The method can further include forming a heat sink terminal over the at least one of the top surface, the bottom surface, the first end surface, the second end surface, the first side surface, or the second side surface. The heat sink terminal can include a pair of bendable leads.

In accordance with yet another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. The method can also include forming a heat source terminal over the top surface or the bottom surface and forming a heat sink terminal over the entirety of the other of the top surface or the bottom surface. The heat source terminal can include a pair of leads.

In accordance with yet another embodiment of the present invention, a method of manufacturing a heat sink component can include providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction. The method can also include forming a heat source terminal over the top surface or the bottom surface and forming a heat sink terminal over the entirety of the other of the top surface or the bottom surface. The heat source terminal can include a pair of wire bond pads.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which:

FIGS. 6A and 6B are perspective views of example heat sink components having an offset terminal spacing distance according to aspects of the present disclosure;

FIGS. 12 through 19 are flowcharts of methods of manufacturing a heat sink component according to aspects of the present disclosure.

Figure 1A:
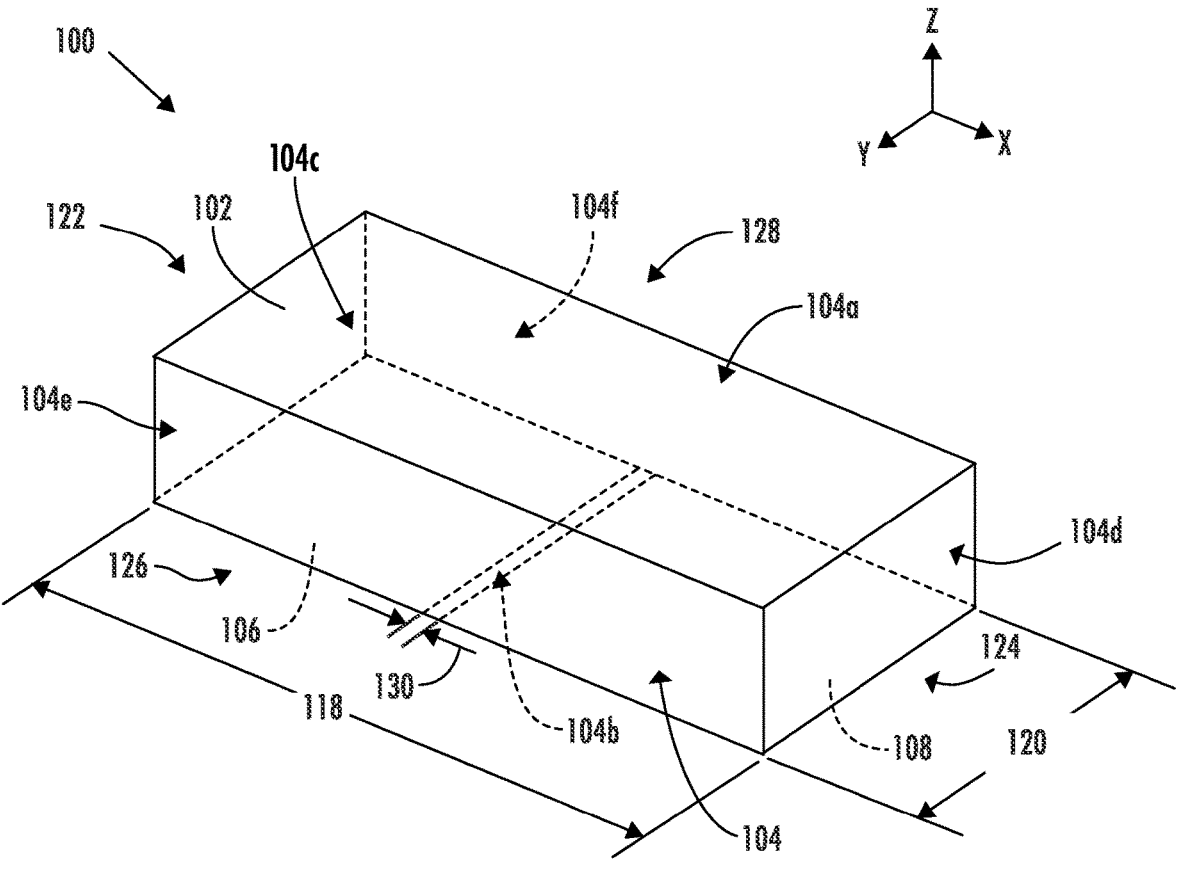
FIG. 1A is a perspective view of an example heat sink component having a terminal spacing distance between first and second terminals according to aspects of the present disclosure.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only and is not intended as limiting the broader aspects of the present invention, which broader aspects are embodied in the exemplary construction.

Generally speaking, the present invention is directed to a heat sink component having excellent heat dissipating capabilities. For example, the heat sink component can include terminations configured for optimizing performance of the heat sink component. The heat sink component can include a body including a thermally conductive material that is electrically non-conductive. The body can define a thickness direction, a longitudinal direction, and a lateral direction that are orthogonal to one another. The body can have a plurality of body surfaces, such as a top surface, a bottom surface opposite the top surface along the thickness direction, and a plurality of side surfaces extending between the top surface and the bottom surface, such as a first end surface, a second end surface opposite the first end surface along the longitudinal direction, a first side surface, and a second side surface opposite the first side surface along the lateral direction. One or more heat source terminals can be formed over one or more body surfaces of the plurality of body surfaces. One or more heat sink terminals can be formed over one or more body surfaces of the plurality of body surfaces.

As used herein, a layer that is "formed over" an object can include the layer being directly formed on the object and the layer being formed over one or more intermediate layers that are between the layer and the object. Further, formed "over" a bottom surface refers to outward from a center of the component.

The heat source terminals can be configured to connect with one or more respective electrical devices or components and conduct heat into the heat sink component from the electrical devices or components. The heat sink terminals can be configured to conduct heat away from the heat sink component. For example, the one or more heat sink terminals can connect the heat sink component with a heat sink to transfer heat from the one or more respective electrical devices or components to the heat sink via the heat sink component.

In some embodiments, one heat source terminal and one heat sink terminal can be formed over the bottom surface of the body of the heat sink component. The heat source terminal can have a heat source terminal area defined by a product of a heat source terminal length and a heat source terminal width. The heat source terminal length may extend in the longitudinal direction defined by the body of the heat sink component, and the heat source terminal width may extend in the lateral direction defined by the body of the heat sink component. The heat sink terminal can have a heat sink terminal area defined by a product of a heat sink terminal length and a heat sink terminal width. The heat sink terminal length may extend in the longitudinal direction, and the heat sink terminal width may extend in the lateral direction.

A terminal spacing distance can be defined between the heat sink terminal and the heat source terminal. For example, the heat source terminal and the heat sink terminal may be spaced apart from one another in the longitudinal direction such that the terminal spacing distance may be defined in the longitudinal direction. The terminal spacing distance may be a longitudinal gap between the heat source terminal and the heat sink terminal. In some embodiments, the heat source terminal and the heat sink terminal can be spaced apart from one another in the lateral direction such that the terminal spacing distance is defined in the lateral direction, e.g., the terminal spacing distance can be a lateral gap between the heat source terminal and the heat sink terminal.

In some embodiments, the terminal spacing distance may be minimized, e.g., to maximize the size of the heat source terminal, the heat sink terminal, or both the heat source terminal and the heat sink terminal. For instance, in some embodiments the heat source terminal and the heat sink terminal may be formed over the bottom surface of the body of the heat sink component. The bottom surface can have a length in the longitudinal direction between a first end of the body and a second end of the body, with the second end opposite the first end in the longitudinal direction. Further, the bottom surface can have a width in the lateral direction between a first side of the body and a second side of the body, with the second side opposite the first side in the lateral direction. The bottom surface may have area defined by a product of the length of the bottom surface and the width of the bottom surface. A ratio can be defined between the area of the bottom surface and a total terminal area, where the total terminal area may be the sum of the heat source terminal area and the heat sink terminal area.

In some embodiments, the ratio of the area of the bottom surface to the total terminal area can be less than about 2, in some embodiments less than about 1.5, in some embodiments less than about 1.2, in some embodiment less than about 1.1, in some embodiment less than about 1.05, and in some embodiments less than about 1.02.

In some embodiments, a ratio of the length of the bottom surface to the terminal spacing distance can be greater than about 2, in some embodiments greater than about 3, in some embodiments greater than about 5, in some embodiments greater than about 7, in some embodiments greater than about 10, in some embodiments greater than about 15, in some embodiments greater than about 20, in some embodiments greater than about 25, in some embodiments greater than about 30, and in some embodiments greater than about 35.

In some embodiments, the terminal spacing distance can be less than about 250 microns, in some embodiments less than about 200 microns, in some embodiments less than about 150 microns, in some embodiments less than about 100 microns, in some embodiments less than about 75 microns, in some embodiments less than about 50 microns, in some embodiments less than about 40 microns, in some embodiments less than about 30 microns, and in some embodiments less than about 20 microns.

In some embodiments, the heat source terminal and the heat sink terminal can be formed over a body surface of the plurality of body surfaces such that the body surface is symmetrical about both a longitudinal centerline axis extending in the longitudinal direction and a lateral centerline axis extending in the lateral direction. The longitudinal centerline axis can be equidistant from a first side of the body and a second side of the body, which is opposite the first side in the lateral direction. The lateral centerline axis can be equidistant from a first end of the body and a second end of the body, which is opposite the first end in the longitudinal direction.

In some embodiments, the lateral centerline axis can bisect the terminal spacing distance. In some embodiments, the longitudinal centerline axis can bisect the terminal spacing distance.

The terminal spacing distance can be offset, e.g., such that the body surface is not symmetrical about both the lateral centerline axis and the longitudinal centerline axis. In some embodiments, the terminal spacing distance can be offset from the lateral centerline axis. For instance, the terminal spacing distance can be offset such that the terminal spacing distance is closer to a first end or a second end of the body than when the lateral centerline axis bisects the terminal spacing distance. In some embodiments, the terminal spacing distance can be offset from the longitudinal centerline axis. For example, the terminal spacing distance can be offset such that the terminal spacing distance is closer to a first side or a second side of the body than when the longitudinal centerline axis bisects the terminal spacing distance.

The one or more heat source terminals and the one or more heat sink terminals can have a variety of configurations. In some embodiments, the one or more heat source terminals may be formed over a single body surface of the plurality of body surfaces of the body of the heat sink component. For example, the one or more heat source terminals can be formed over only the bottom surface, or the one or more heat source terminals can be formed over only the top surface. In some embodiments, the one or more heat sink terminals may be formed over a single body surface of the plurality of body surfaces. For instance, the one or more heat sink terminals can be formed over only the bottom surface, or the one or more heat sink terminals can be formed over only the top surface. The one or more heat source terminals may be formed over the same single body surface as the one or more heat sink terminals, or the one or more heat source terminals may be formed over a different body surface.

In some embodiments, the one or more heat source terminals can be full or partial wrap terminals or arranged as land grid array (LGA) terminals. For example, a heat source terminal can wrap around an end of the body such that the heat source terminal is formed over the top surface, the bottom surface, an end surface, and the first and second side surfaces of the body. As another example, a heat source terminal can partially wrap around an end of the body such that the heat source terminal is formed over the top surface, the bottom surface, and an end surface of the body without being formed over the first side surface and/or the second side surface of the body. In a still further example, a plurality of heat source terminals can be arranged in a grid or other suitable pattern, e.g., for LGA-type mounting. For instance, in an embodiment in which a plurality of heat source terminals are formed over the bottom surface, each heat source terminal of the plurality of heat source terminals can be spaced apart from the first end surface, the second end surface, the first side surface, and the second side surface, and the plurality of side surfaces can be free of electrically conductive material. The one or more heat source terminals can be arranged in a manner that aligns with heat source terminals of a device (e.g., a circuit board, electrical component, etc.) to which the heat sink component is configured to be mounted.

In some embodiments, the one or more heat sink terminals can be full or partial wrap terminals or arranged as LGA terminals. For instance, a heat sink terminal can wrap around an end of the body such that the heat sink terminal is formed over the top surface, the bottom surface, an end surface, and the first and second side surfaces of the body. As a further example, a heat sink terminal can partially wrap around an end of the body such that the heat sink terminal is formed over the top surface, the bottom surface, and an end surface of the body without being formed over the first side surface and/or the second side surface of the body. In yet another example, a plurality of heat sink terminals can be arranged in a grid or other suitable pattern, e.g., for LGA-type mounting. For instance, in an embodiment in which a plurality of heat sink terminals are formed over the bottom surface, each heat sink terminal of the plurality of heat sink terminals can be spaced apart from the first end surface, the second end surface, the first side surface, and the second side surface, and the plurality of side surfaces can be free of electrically conductive material. The one or more heat sink terminals can be arranged in a manner that aligns with heat sink terminals of a device (e.g., a circuit board, electrical component, etc.) to which the heat sink component is configured to be mounted.

In some embodiments, the heat sink terminal comprises at least one flange extending outward beyond the body. The at least one flange can increase the bonding area at the heat sink terminal, which can improve heat conduction through the heat sink component. For example, in some embodiments, the heat sink terminal can be formed over the bottom surface of the body adjacent an end of the body, and the heat sink terminal can include a flange extending outward from the body beyond one of the first side, the second side, or the end of the body. In some embodiments, the flange is a first flange, and the heat sink terminal also includes a second flange extending outward from the body beyond another of the first side, the second side, or the end of the body. In some embodiments, the heat sink terminal further includes a third flange extending outward from the body beyond the remaining one of the first side, the second side, or the end of the body. For instance, the first flange can extend beyond the first side, the second flange can extend beyond the second side, and the third flange can extend beyond the end of the body.

In some embodiments, the heat source terminal comprises at least one flange extending outward beyond the body. For example, in some embodiments, the heat source terminal can be formed over the bottom surface of the body adjacent an end of the body, and the heat source terminal can include a flange extending outward from the body beyond one of the first side, the second side, or the end of the body. In some embodiments, the flange is a first flange, and the heat source terminal also includes a second flange extending outward from the body beyond another of the first side, the second side, or the end of the body. In some embodiments, the heat source terminal further includes a third flange extending outward from the body beyond the remaining one of the first side, the second side, or the end of the body. For instance, the first flange can extend beyond the first side, the second flange can extend beyond the second side, and the third flange can extend beyond the end of the body.

In some embodiments, the heat sink terminal can be formed over the top surface and include a flange configured to bend downward toward the bottom surface to contact a heat sink. For instance, the flange may be formed from a metal having properties (such as thickness, material properties, etc.) that allow the metallic flange to bend downward to a heat sink of a device to which the heat sink component is mounted. The flange can contact the heat sink of the device, and in some embodiments may be secured to the device, such that heat conducted from the one or more heat source terminals through the body to the flange of the heat sink terminal can be conducted away from the heat sink component and into the heat sink of the device, thereby conducting heat away from the heat source.

The heat sink component may be configured to mount to a device, which can be a circuit board, a multilayer ceramic component, or other suitable electric device. The heat sink component may have a variety of configurations and/or features for mounting to the device. In some embodiments, the heat source terminal can include at least one lead, can include at least one pair of ribbons or leads, can be configured for soldering to the device, and/or can include a pair of wire bond pads.

In some embodiments, the heat sink component can include at least one pair of flexible or bendable leads. In some embodiments, the at least one pair of flexible or bendable leads can extend from the heat source terminal. In some embodiments, the at least one pair of flexible or bendable leads can extend from the heat sink terminal. In some embodiments, the at least one pair of bendable leads can include a first pair of bendable leads extending from the heat source terminal and a second pair of bendable leads extending from the heat sink terminal. For example, the flexible or bendable leads flex, bend, or otherwise deform to facilitate mounting the heat sink component on top of an existing component on a circuit board or the like.

In some embodiments, the heat sink terminal can be formed over the entirety of a body surface of the body of the heat sink component. For example, the heat sink terminal can be formed over the entirety of the bottom surface of the body such that the heat sink terminal has a length and a width that are coextensive with a length and a width of the bottom surface and none of the bottom surface is exposed. The heat source terminal can be formed over the body surface opposite the body surface entirely covered by the heat sink terminal, and the heat source terminal can include a pair of leads or a pair of wire bond pads for connecting to a device (e.g., a circuit board, a multilayer ceramic capacitor, or other electric component).

A component assembly can include a device comprising a top surface and a plurality of terminals exposed on the top surface and a heat sink component as described herein. A heat source terminal of the heat sink component can be connected with one of the plurality of terminals of the device, and a heat sink terminal of the heat sink component can be connected with another of the plurality of terminals of the device. In some embodiments, the device includes a circuit board. In some embodiments, the device includes a multilayer ceramic component.

In some embodiments, the heat sink component can have a plurality of heat source terminals, and the heat sink component can provide connections between the heat source terminals. For example, the connections can be or include direct electrical connections such that the heat sink component acts as an interposer between various heat source terminals. As another example, the connections can be or include thin-film components (e.g., capacitors, inductors, resistors, etc.).

For example, a first heat source terminal and a second heat source terminal may be formed over the bottom surface of the body, and a first via and a second via may be formed in the body. The first via may connected with the first heat source terminal, and the second via may connected with the second heat source terminal. The first and second vias can extend to the top surface of the body. A thin film component can be formed over the top surface of the body and electrically connected between the first via at the top surface and the second via at the top surface such that the thin film component is electrically connected between the two heat source terminals. However, in other embodiments, a conductive trace can be formed over the top surface of the body and can electrically connect the vias at the top surface such that the heat source terminals are electrically connected together by the conductive trace.

The heat sink component can include one or more thin film components. The one or more thin film components can include one or more of a resistor, varistor, capacitor, inductor, and/or combinations thereof, such as a thin film filter. The thin film components may include one or more layers of conductive materials, dielectric materials, resistive materials, inductive materials, or other materials that are precisely formed using "thin film" technology.

As one example, the heat sink component can include a thin film varistor. The varistor can include barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 1 micron to 100 microns, in some embodiments, from about 2 microns to 80 microns.

As another example, the thin film component(s) can include a thin film resistor including one or more resistive layers. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness.

As another example, the thin film component(s) can include a thin film capacitor including one or more dielectric layers. As examples, the dielectric layer(s) may include one or more suitable ceramic materials. Example suitable materials include alumina (Al2O3), aluminum nitride (AlN), beryllium oxide (BeO), aluminum oxide (Al2O3), boron nitride (BN), silicon (Si), silicon carbide (SiC), silica (SiO2), silicon nitride (Si3N4), gallium arsenide (GaAs), gallium nitride (GaN), zirconium dioxide (ZrO2), mixtures thereof, oxides and/or nitrides of such materials, or any other suitable ceramic material. Additional example ceramic materials include barium titanate (BaTiO3), calcium titanate (CaTiO3), zinc oxide (ZnO), ceramics containing low-fire glass, or other glass-bonded materials.

The thin film component can include one or more layers having thicknesses ranging from about 0.001 μm to about 1,000 μm, in some embodiments from about 0.01 μm to about 100 μm, in some embodiments from about 0.1 μm to about 50 μm, in some embodiments from about 0.5 μm to about 20 μm. The respective layer(s) of materials forming thin film component may be applied using specialized techniques based on etching, photolithography, PECVD (Plasma Enhanced Chemical Vapor Deposition) processing or other techniques.

The body of the heat sink component may include any suitable material having a generally low thermal resistivity (e.g., less than about $6.67\times10^{-3}$ m·° C./W), and a generally high electrical resistivity (e.g., greater than about $10^{14}$ Ω·cm). A thermal resistivity of $6.67\times10^{-3}$ m° C./W is equivalent with a thermal conductivity of about 150 W/m·° C. In other words, suitable materials for the body of the heat sink component may have a generally high thermal conductivity, such as greater than about 150 W/m·° C.

For example, in some embodiments, the body of the heat sink component may be made from a material having a thermal conductivity between about 100 W/m·° C. and about 300 W/m·° C. at about 22° C. In other embodiments, the body of the heat sink component may be made from a material having a thermal conductivity between about 125 W/m·° C. and about 250 W/m·° C. at about 22° C. In other embodiments, the body of the heat sink component may be made from a material having a thermal conductivity between about 150 W/m·° C. and about 200 W/m·° C. at about 22° C.

In some embodiments, the body of the heat sink component may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the body of the heat sink component may comprise aluminum nitride. For example, in some embodiments the body of the heat sink component may be made from any suitable composition including aluminum nitride. In some embodiments, the body of the heat sink component may be made primarily from aluminum nitride. For example, the body of the heat sink component may contain additives or impurities. In other embodiments, the body of the heat sink component comprises beryllium oxide. For example, in some embodiments the body of the heat sink component may be made from any suitable composition including beryllium oxide. In some embodiments, the body of the heat sink component may be made primarily from beryllium oxide. For example, the body of the heat sink component may contain additives or impurities.

Figure 1B:
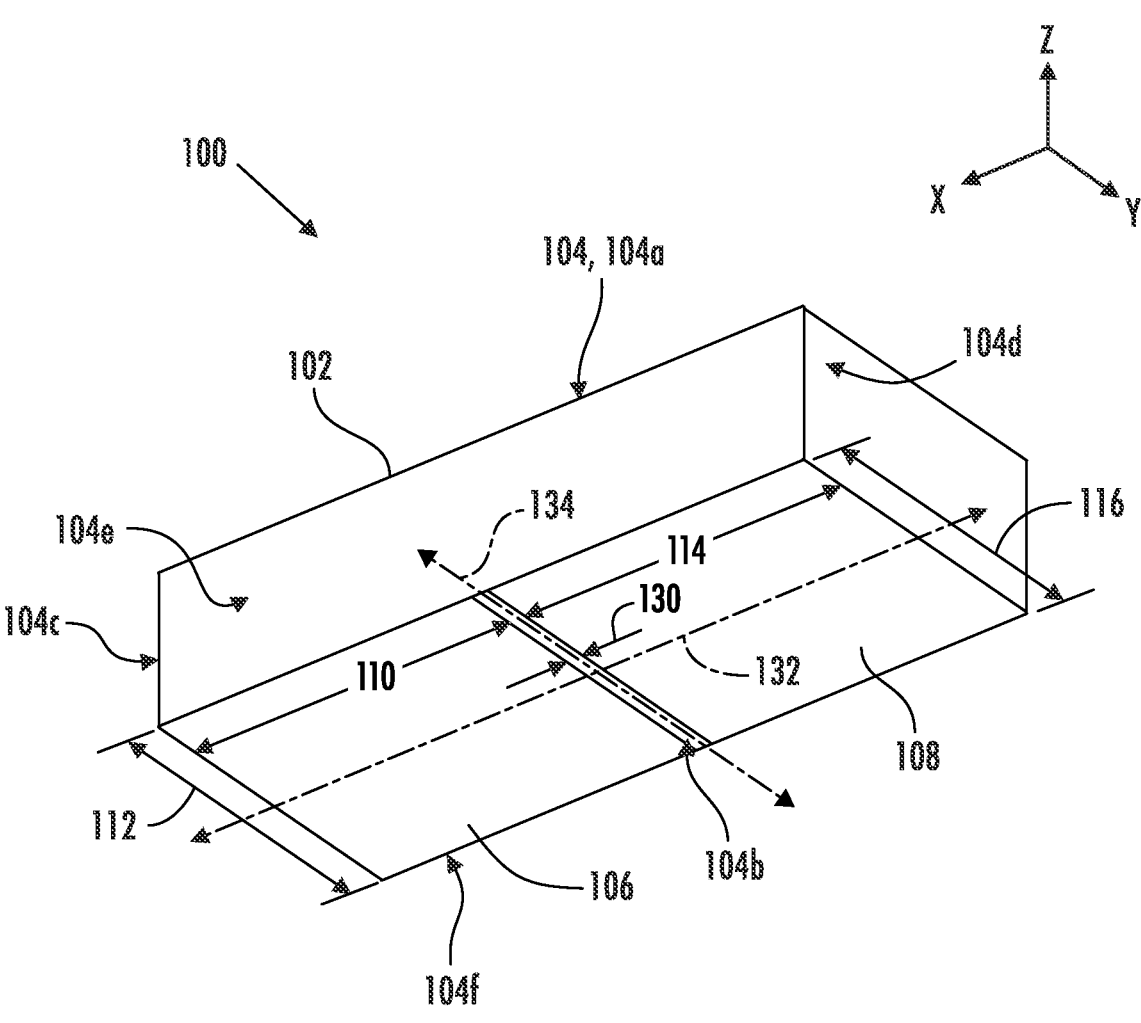
FIG. 1B is a perspective view of a bottom surface of the heat sink component of FIG. 1A.

Referring to FIGS. 1A and 1B, a heat sink component 100 can be configured to increase or maximize contact between a heat source, a heat sink, or both, e.g., to direct heat from the heat source to the heat sink. Such conduction of heat away from the heat source can help manage the temperature of a component or device that includes the heat source. For instance, heat transfer from the heat source to the heat sink can help prevent overheating of the component or device including the heat source.

The heat sink component 100 can include a body 102 including a thermally conductive material that is electrically non-conductive. The body can define a longitudinal direction X, a lateral direction Y, and a thickness direction Z that are orthogonal to one another. The body 102 can have a plurality of body surfaces 104, including a top surface 104a, a bottom surface 104b opposite the top surface 104a along the thickness direction Z, and a plurality of side surfaces, such as a first end surface 104c, a second end surface 104d opposite the first end surface 104c along the longitudinal direction X, a first side surface 104e, and a second side surface 104f opposite the first side surface 104e along the lateral direction Y. As shown in FIGS. 1A and 1B, the plurality of side surfaces 104c, 104d, 104e, 104f extend in the thickness direction Z between the top surface 104a and the bottom surface 104b.

One or more heat source terminals 106 can be formed over at least one body surface 104 of the plurality of body surfaces 104 of the body 102. The heat source terminal(s) 106 can be configured to connect with one or more respective electrical devices or components and conduct heat into the heat sink component 100 from the electrical devices or components. In the embodiment of FIGS. 1A and 1B, the heat sink component 100 includes one heat source terminal 106 formed over the bottom surface 104b of the body 102. In other embodiments, a single heat source terminal 106 can be formed over the top surface 104a or one side surface of the plurality of side surfaces 104c, 104d, 104e, 104f. Other embodiments of the one or more heat source terminals 106 are described in greater detail herein.

One or more heat sink terminals 108 can be formed over at least one body surface 104 of the plurality of body surfaces 104 of the body 102. The heat sink terminal(s) 108 can be configured to connect with a heat sink (e.g., of a circuit board to which the heat sink component 100 is mounted). As shown in FIGS. 1A and 1B, the depicted embodiment of the heat sink component 100 includes one heat sink terminal 108 formed over the bottom surface 104b of the body 102. In other embodiments, a single heat sink terminal 108 can be formed over the top surface 104a or one side surface of the plurality of side surfaces 104c, 104d, 104e, 104f. Further embodiments of the one or more heat sink terminals 108 are described in greater detail herein.

Referring to FIG. 1B, the heat source terminal 106 can have a heat source terminal area defined by a product of a heat source terminal length 110 and a heat source terminal width 112. The heat source terminal length 110 can extend in the longitudinal direction X defined by the body 102, and the heat source terminal width 112 can extend in the lateral direction Y defined by the body 102.

The heat sink terminal 108 can have a heat sink terminal area defined by a product of a heat sink terminal length 114 and a heat sink terminal width 116. The heat sink terminal length 114 can extend in the longitudinal direction X, and the heat sink terminal width 116 can extend in the lateral direction Y.

Referring to FIG. 1A, the bottom surface 104b can have an area defined by a product of a length 118 of the bottom surface 104b and a width 120 of the bottom surface 104b. The length 118 of the bottom surface 104b can extend in the longitudinal direction X between a first end 122 of the body 102 and a second end 124 of the body 102, with the second end 124 opposite the first end 122 in the longitudinal direction X. Further, the width 120 of the bottom surface 104b can extend in the lateral direction Y between a first side 126 of the body 102 and a second side 128 of the body 102, with the second side 128 opposite the first side 126 in the lateral direction Y. As shown in FIG. 1A, the length 118 and width 120 of the bottom surface 104b are also the length and width of the body 102.

A ratio can be defined between the area of the bottom surface 104b and a total terminal area, where the total terminal area is the sum of the heat source terminal area and the heat sink terminal area. In some embodiments, the ratio of the area of the bottom surface 104b to the total terminal area can be less than about 2, such as less than about 1.5, less than about 1.2, less than about 1.1, less than about 1.05, or less than about 1.02.

A terminal spacing distance 130 can be defined between the heat source terminal 106 and the heat sink terminal 108. For example, the heat source terminal 106 and the heat sink terminal 108 can be spaced apart from one another in the longitudinal direction X such that the terminal spacing distance 130 is defined in the longitudinal direction X and is a longitudinal gap between the heat source terminal 106 and the heat sink terminal 108.

In other embodiments, the heat source terminal 106 and the heat sink terminal 108 can be spaced apart from one another in the lateral direction Y such that the terminal spacing distance 130 is defined in the lateral direction Y, e.g., the terminal spacing distance 130 can be a lateral gap between the heat source terminal 106 and the heat sink terminal 108. For instance, in some embodiments the heat sink component 100 can have a reverse geometry, with the heat source terminal 106 can be defined along the first side 126 rather than the first end 122 of the body 102, and the heat sink terminal 108 can be defined along the second side 128 rather than the second end 124 of the body. The heat source terminal 106 and the heat sink terminal 108 can be spaced apart from one another along the lateral direction Y to define the terminal spacing distance 130.

A ratio can be defined between the length 118 of the bottom surface 104*b* and the terminal spacing distance 130. In some embodiments, the ratio of the length 118 of the bottom surface 104*b* to the terminal spacing distance 130 can be greater than about 2, such as greater than about 3, greater than about 5, greater than about 7, greater than about 10, greater than about 15, greater than about 20, greater than about 25, greater than about 30, or greater than about 35.

Referring to FIG. 1B, the heat source terminal 106 and the heat sink terminal 108 can be formed over a body surface 104 such as the bottom surface 104*b* in such a manner that the body surface 104 is symmetrical about both a longitudinal centerline axis 132 extending in the longitudinal direction X and a lateral centerline axis 134 extending in the lateral direction Y. The longitudinal centerline axis 132 can be equidistant from the first side 126 and the second side 128 of the body 102. The lateral centerline axis 134 can be equidistant from the first end 122 and the second end 124 of the body 102. In some embodiments, such as the embodiment illustrated in FIGS. 1A and 1B, the lateral centerline axis 134 can bisect the terminal spacing distance 130. In other embodiments, the longitudinal centerline axis 132 can bisect the terminal spacing distance 130.

Figure 2:
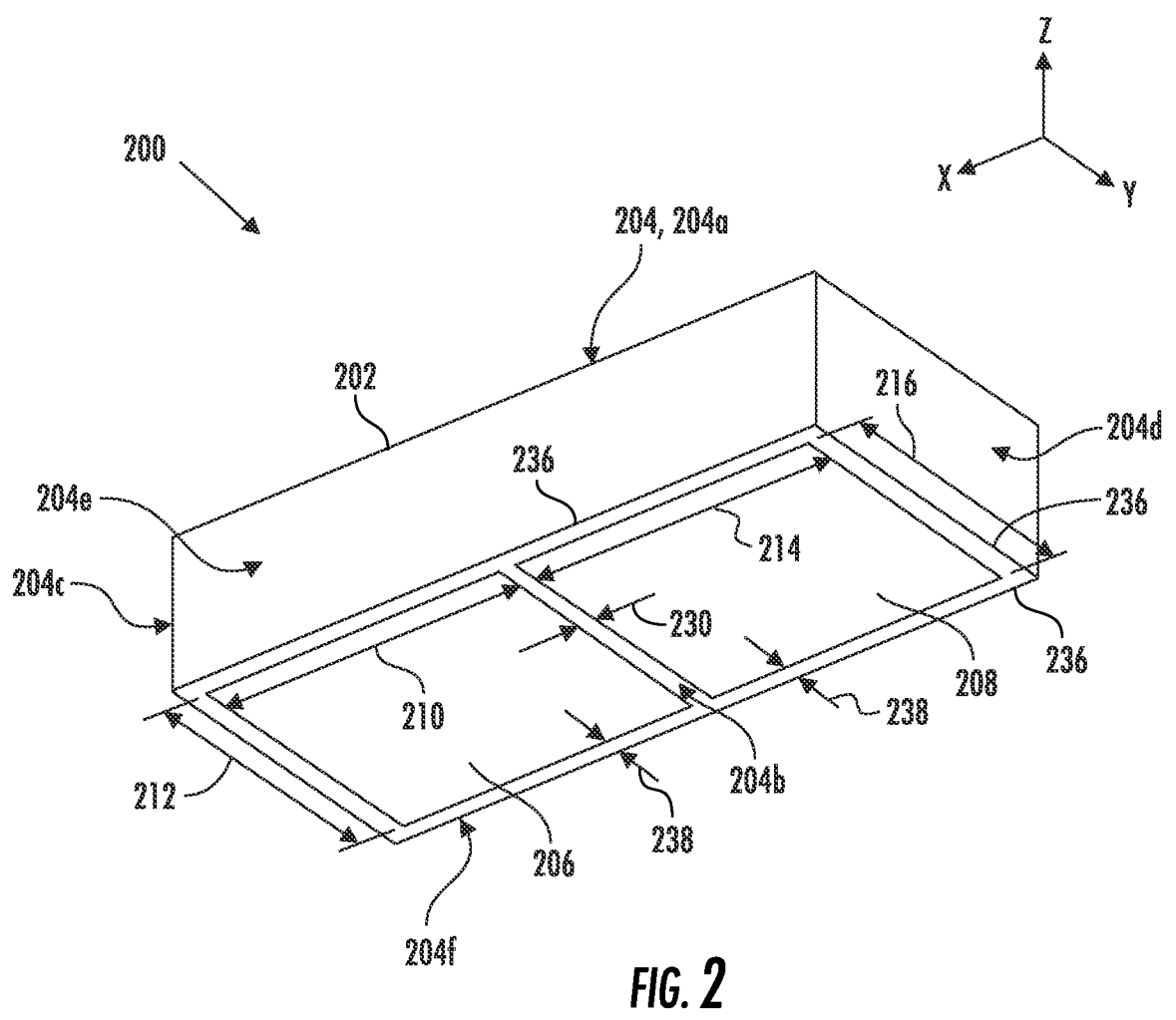
FIG. 2 is a perspective view of a bottom surface of an example heat sink component having first and second terminals spaced from edges of a body of the heat sink component and a terminal spacing distance between the first and second terminals according to aspects of the present disclosure.

Turning to FIG. 2, a heat sink component 200 can be generally configured similarly to the heat sink component 100 of FIGS. 1A and 1B. The heat sink component 200 can include a body 202 and a plurality of body surfaces 204, such as a top surface 204*a*, a bottom surface 204*b*, a first end surface 204*c*, a second end surface 204*d*, a first side surface 204*e*, and a second side surface 204*f*. A heat source terminal 206 and a heat sink terminal 208 can be formed over at least one of the body surfaces 204, e.g. both terminals 206, 208 can be formed over the bottom surface 204*b* as shown in FIG. 2. A terminal spacing distance 230 can be defined between the heat source terminal 206 and the heat sink terminal 208.

In the embodiment of FIG. 2, the heat source terminal 206 and the heat sink terminal 208 are each spaced apart from a plurality of edges 236 defining the bottom surface 204*b*. For example, an edge spacing distance 238 can be defined between the heat source terminal 206 and an edge 236 of the bottom surface 204*b* extending in the longitudinal direction X. As further illustrated in FIG. 2, an edge spacing distance 238 can be defined between the heat sink terminal 208 and the edge 236 of the bottom surface 204*b* extending in the longitudinal direction X.

Figure 3:
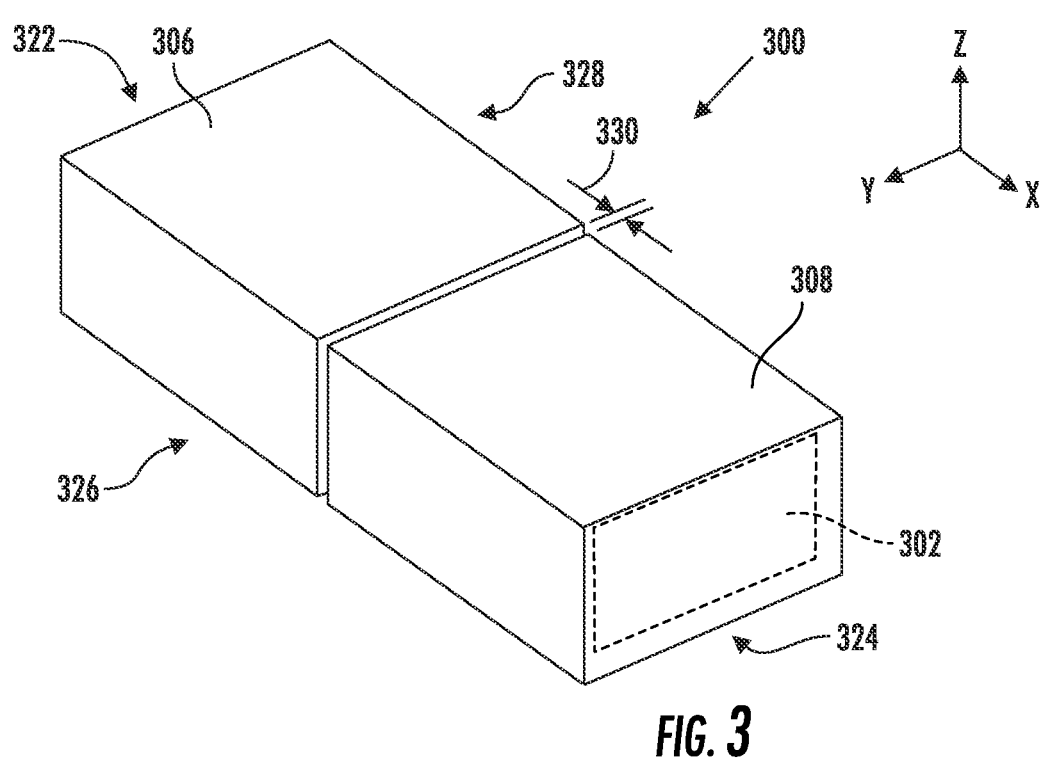
FIG. 3 is a perspective view of an example heat sink component having fully wrapped first and second terminals according to aspects of the present disclosure.

Referring to FIG. 3, a heat sink component 300 can be generally configured similarly to the heat sink component 100 of FIGS. 1A and 1B. The heat sink component 300 can include a heat source terminal 306, a heat sink terminal 308, a first end 322, a second end 324, a first side 326, and a second side 328. In the embodiment of FIG. 3, each of the heat source terminal 306 and the heat sink terminal 308 fully wrap a respective end 322, 324 of the heat sink component 300. For example, the heat source terminal 306 can be formed over each of the surfaces of a body 302 (an end of which is shown in dashed lines) of the heat sink component 300, e.g., a top surface, a bottom surface, a first end surface, a second end surface, a first side surface, and a second side surface of the body, to fully wrap around the first end 322. Similarly, the heat sink terminal 308 can be formed over each of the surfaces of the body of the heat sink component 300, e.g., a top surface, a bottom surface, a first end surface, a second end surface, a first side surface, and a second side surface of the body, to fully wrap around the second end 324.

A terminal spacing distance 330 can be defined between the heat source terminal 306 and the heat sink terminal 308. A ratio can be defined between a length of the body of the heat sink component 300 and the terminal spacing distance 330. In some embodiments, the ratio of the length of the body to the terminal spacing distance 330 can be greater than about 2, in some embodiments greater than about 3, in some embodiments greater than about 5, in some embodiments greater than about 7, in some embodiments greater than about 10, in some embodiments greater than about 15, in some embodiments greater than about 20, in some embodiments greater than about 25, in some embodiments greater than about 30, and in some embodiments greater than about 35.

Figure 4:
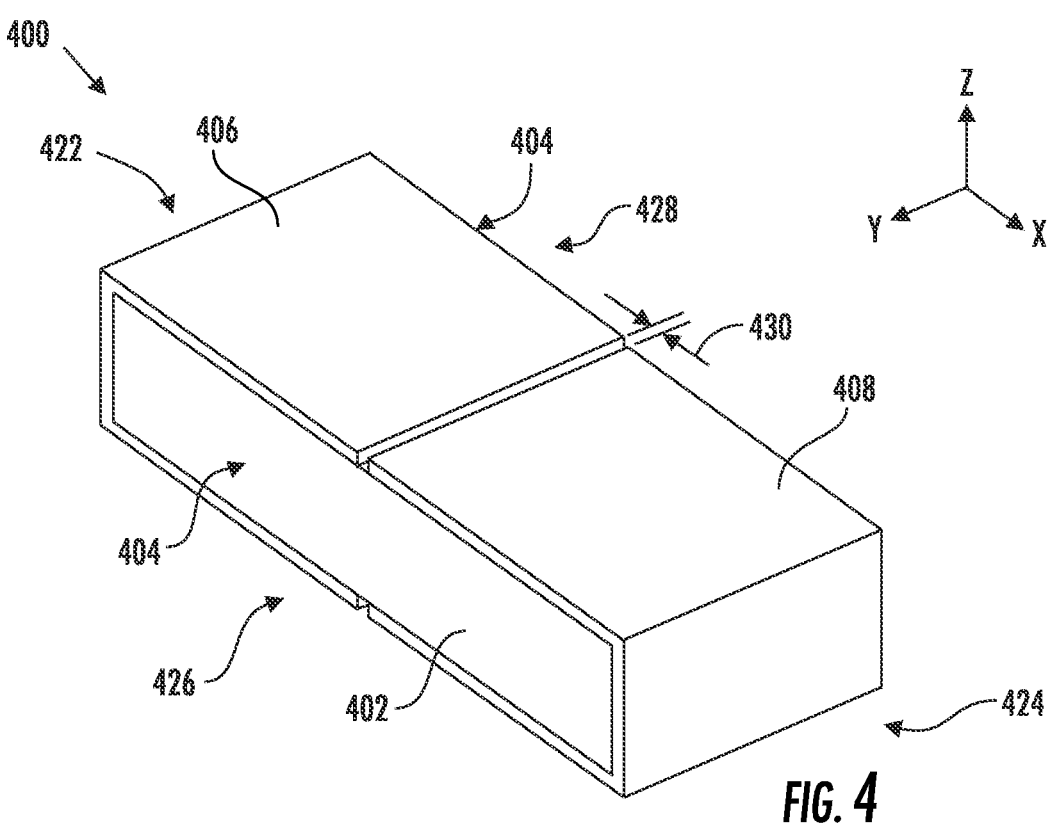
FIG. 4 is a perspective view of an example heat sink component having partially wrapped first and second terminals according to aspects of the present disclosure.

Turning now to FIG. 4, a heat sink component 400 can be generally configured similarly to the heat sink component 100 of FIGS. 1A and 1B. The heat sink component 400 can include a body 402 having a plurality of body surfaces 404, a heat source terminal 406, a heat sink terminal 408, a first end 422, a second end 424, a first side 426, and a second side 428. In the embodiment of FIG. 4, each of the heat source terminal 406 and the heat sink terminal 408 partially wrap a respective end 422, 424 of the heat sink component 400. For instance, the heat source terminal 406 can be formed over a plurality of body surfaces 404 of the body 402, such as a top surface, a bottom surface, and a first end surface to partially wrap around the first end 422 as shown in FIG. 4. The heat sink terminal 408 can be formed over a plurality of body surfaces 404 of the body 402, such as a top surface, a bottom surface, and a second end surface to partially wrap around the second end 424.

A terminal spacing distance 430 can be defined between the heat source terminal 406 and the heat sink terminal 408. A ratio can be defined between a length 418 of the body 402 of the heat sink component 400 and the terminal spacing distance 430. In some embodiments, the ratio of the length 418 of the body 402 to the terminal spacing distance 430 can be greater than about 2, in some embodiments greater than about 3, in some embodiments greater than about 5, in some embodiments greater than about 7, in some embodiments greater than about 10, in some embodiments greater than about 15, in some embodiments greater than about 20, in some embodiments greater than about 25, in some embodiments greater than about 30, and in some embodiments greater than about 35.

Figure 5:
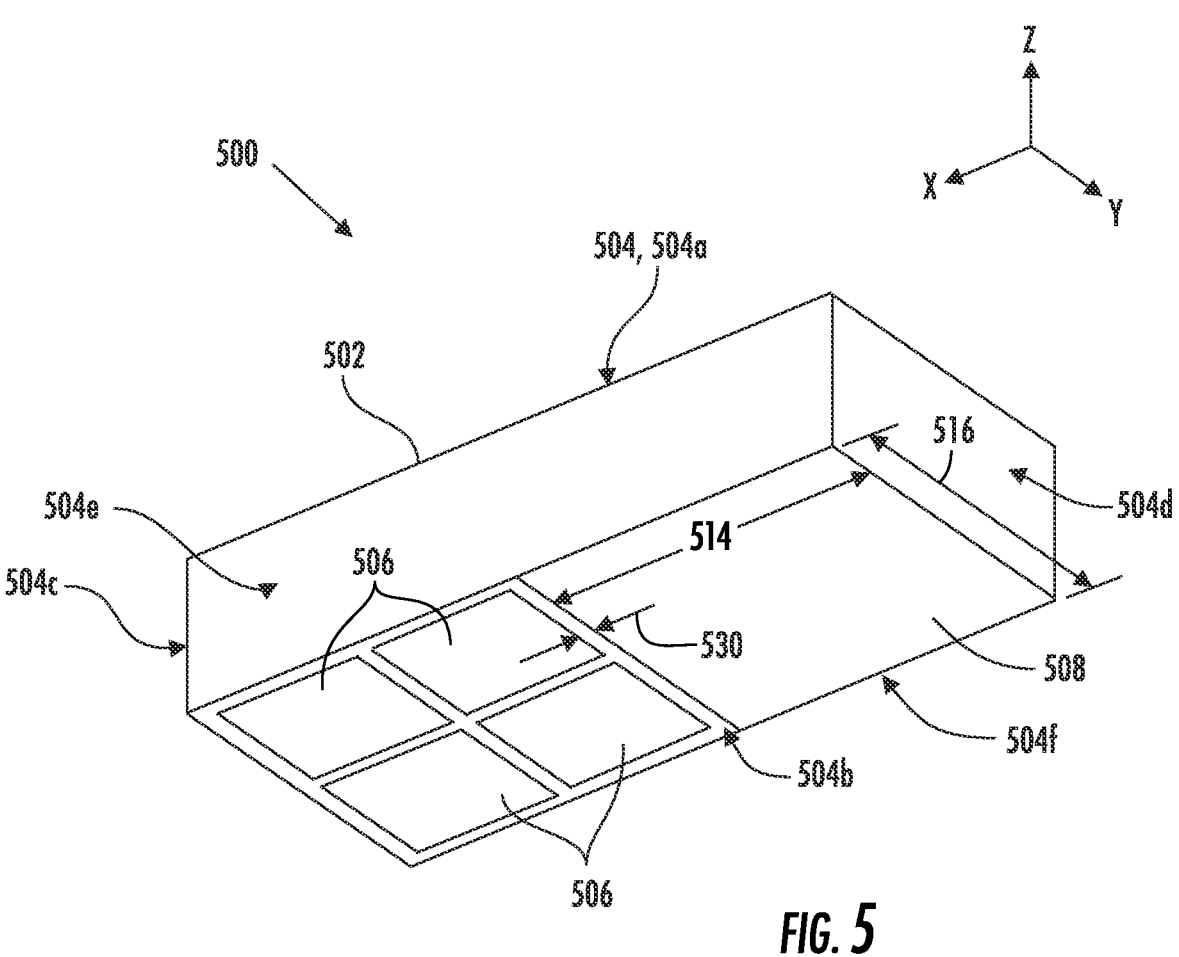
FIG. 5 is a perspective view of a bottom surface of an example heat sink component having a plurality of terminals configured for land grid array-type mounting according to aspects of the present disclosure.
Figure 10A:
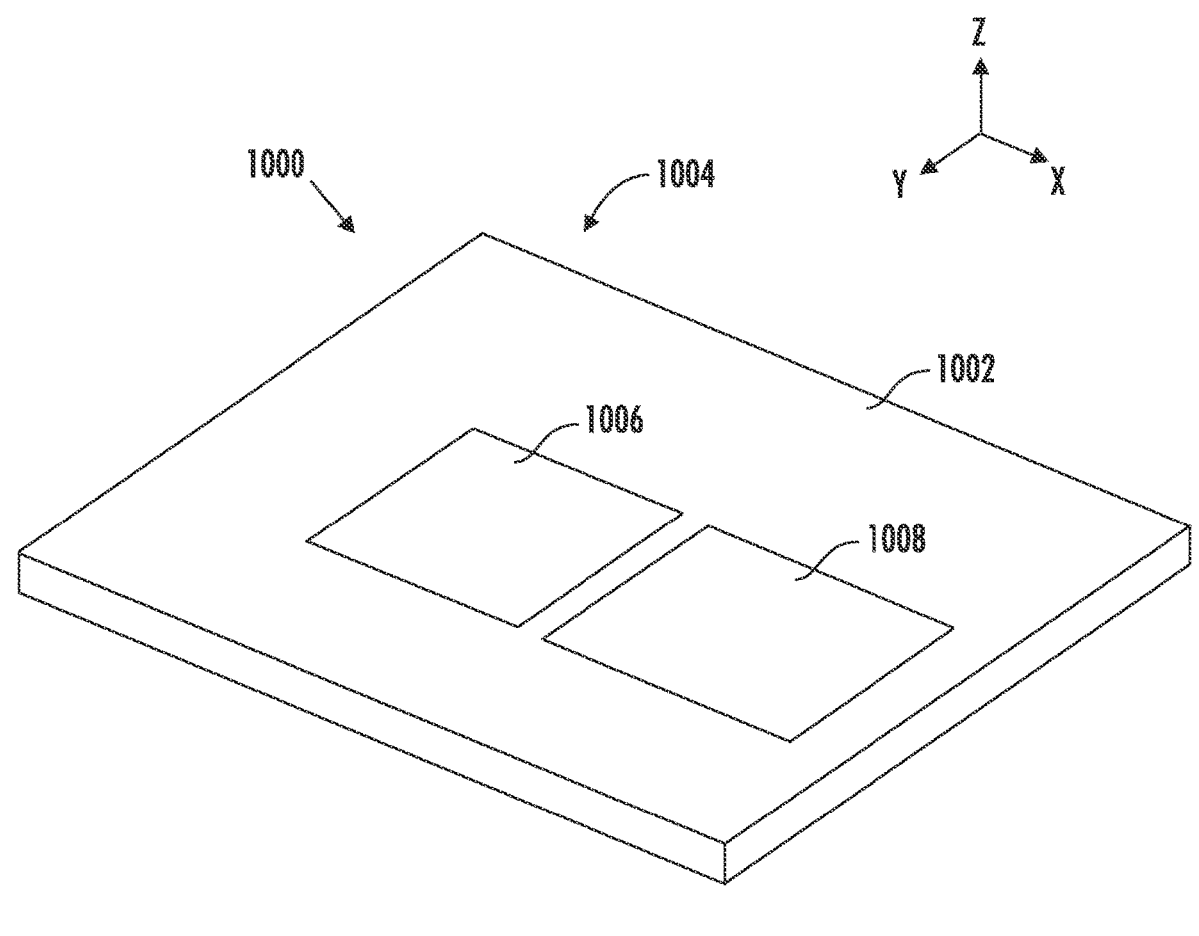
FIG. 10A illustrates an example device of a component assembly according to aspects of the present disclosure.
Figure 10B:
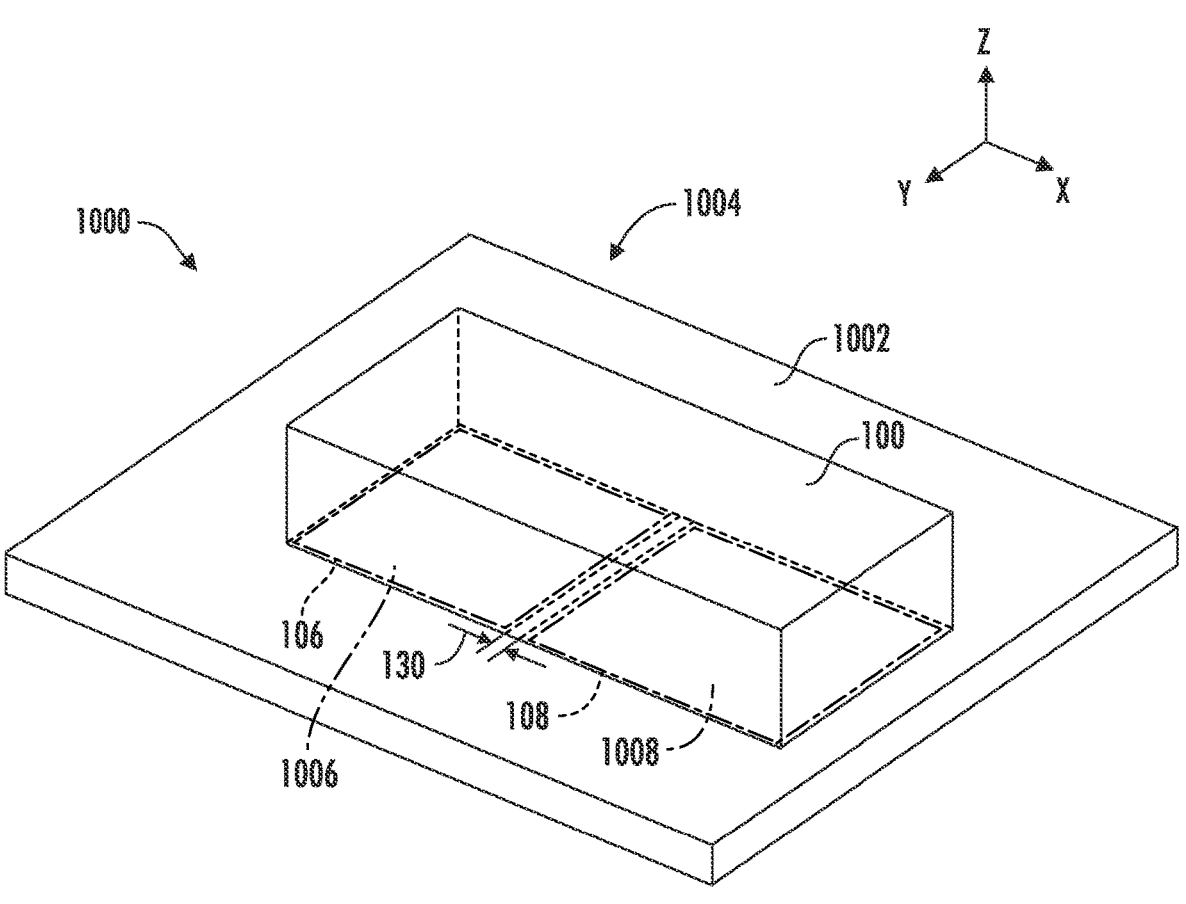
FIG. 10B illustrates an example component assembly including the device of FIG. 10A and the heat sink component of FIG. 1A according to aspects of the present disclosure.

Referring now to FIG. 5, a heat sink component 500 can be generally configured similarly to the heat sink component 100 of FIGS. 1A and 1B. The heat sink component 500 can include a body 502, and a plurality of heat source terminals 506 can be formed over a bottom surface 504*b* of the body 502 of the heat sink component 500. The heat sink component 500 can be configured for land grid array-type mounting, and the plurality of heat source terminals 106 can be arranged in a variety of configurations. For example, the heat source terminals 106 can be arranged in a grid or other suitable pattern. The heat source terminals 106 can be arranged in a manner that aligns with heat source terminals of a device (e.g., a circuit board, an electrical component, etc. such as shown in FIGS. 10A and 10B), to which the heat sink component 500 is configured to be mounted.

Figure 6A:
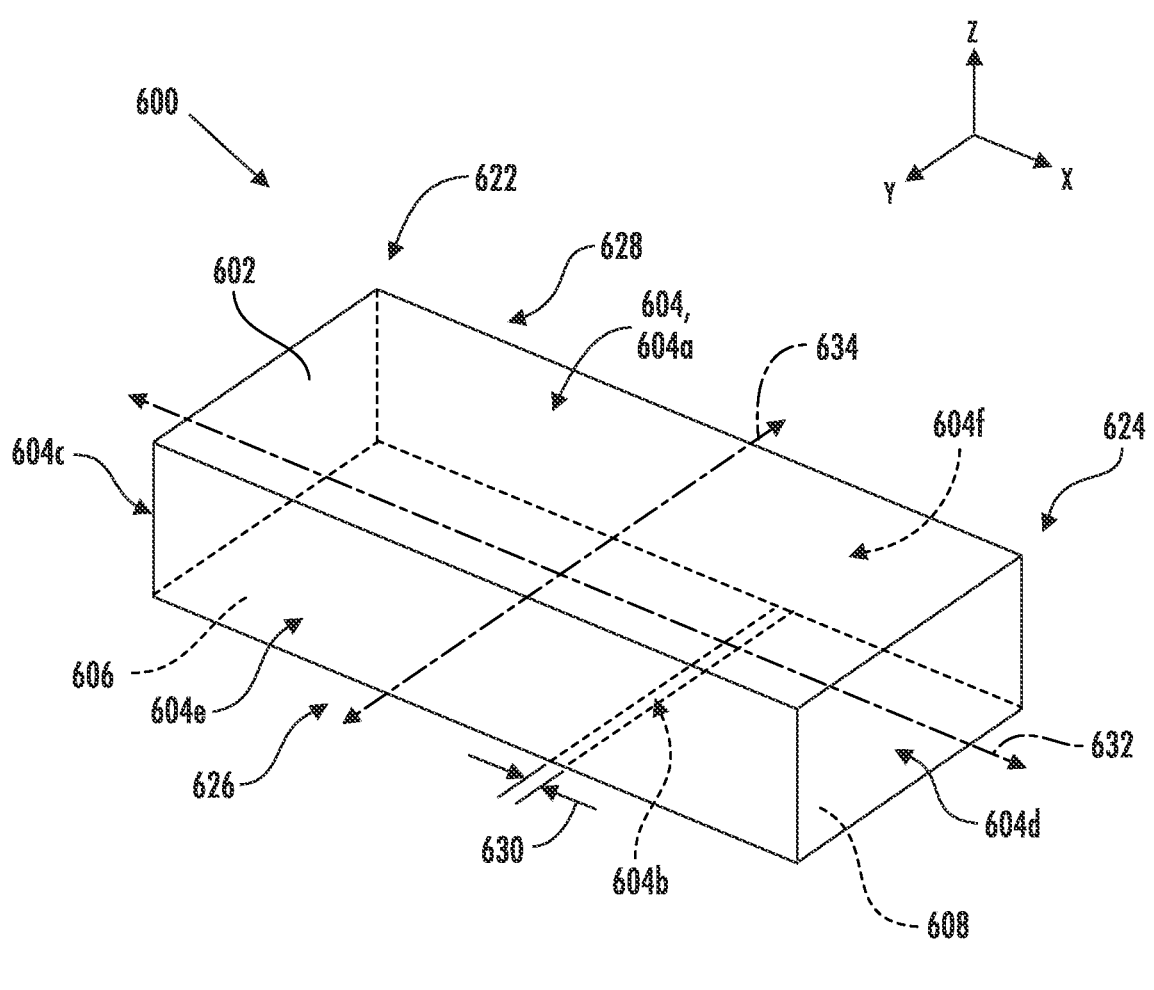

As shown in FIGS. 6A and 6B, the heat source terminal and the heat sink terminal can be sized differently from one another such that the terminal spacing distance is offset from a centerline axis of the body. More particularly, in FIGS. 6A and 6B, a heat sink component 600 can be generally configured similarly to the heat sink component 100 of FIGS. 1A and 1B. The heat sink component 600 can include a body 602, a heat source terminal 606 formed over at least one surface 604 of the body 602, and a heat sink terminal 608 formed over at least one surface 604 of the body 602. A terminal spacing distance 630 can be defined between the heat source terminal 606 and the heat sink terminal 608.

In the embodiment depicted in FIG. 6A, the heat source terminal 606 and the heat sink terminal 608 are both formed over a bottom surface 604b of the body 602. In the embodiment of FIG. 6B, the heat source terminal 606 fully wraps a first end 622 of the body 602 such that the heat source terminal 606 is formed over every surface 604 of the body 602, and the heat sink terminal 608 fully wraps a second end 624 of the body 602 such that the heat sink terminal 608 is formed over every surface 604 of the body 602.

As shown in both FIG. 6A and FIG. 6B, the terminal spacing distance 630 can be offset, e.g., toward one end or one side of the body 602. For example, referring to FIG. 6A, the terminal spacing distance 630 can be offset such that the bottom surface 604b is not symmetrical about both a longitudinal centerline axis 632 and a lateral centerline axis 634. Referring to FIG. 6B, the terminal spacing distance 630 can be offset such that the heat sink component 600 is not symmetrical about both the longitudinal centerline axis 632 and the lateral centerline axis 634.

In some embodiments, the terminal spacing distance 630 can be offset from the lateral centerline axis 634 as shown in FIGS. 6A and 6B. For instance, the terminal spacing distance 630 can be offset such that the terminal spacing distance 630 is closer to the second end 624 of the body 602 than when the lateral centerline axis 634 bisects the terminal spacing distance 630, e.g., as shown in the embodiment of FIG. 1B with respect to the terminal spacing distance 130 and lateral centerline axis 134.

FIGS. 7A through 7F illustrate a heat sink component 700 generally configured similarly to the heat sink component 100 of FIGS. 1A and 1B. The heat sink component 700 can include a body 702 and a plurality of body surfaces 704, including a top surface 704a, a bottom surface 704b, a first end surface 704c, a second end surface 704d, a first side surface 704e, and a second side surface 704f. A terminal spacing distance 730 can be defined between a heat source terminal 706 and a heat sink terminal 708 formed over at least one body surface 704, such as the bottom surface 704b.

The heat sink terminal 708 can include at least one flange 740 extending outward beyond the body 702. For example, in some embodiments, the heat sink terminal 708 can be formed over the bottom surface 704b adjacent a second end 724 of the body 702. The heat sink terminal 708 can include a flange 740 extending outward from the body 702 beyond one of the first side 726, the second side 728, or the second end 724 of the body 702. Referring to FIGS. 7B through 7D, in some embodiments, the flange 740 is a first flange 740a extending outward beyond the first side 726 of the body 702, and the heat sink terminal 708 also includes a second flange 740b extending outward beyond the second end 724 of the body 702. In some embodiments, the heat sink terminal 708 further includes a third flange 740c extending outward from the body beyond the second side 728 of the body 702. Other numbers and configurations of flanges 740 may be used as well, e.g., different sized flanges, different numbers of flanges extending beyond a side or end of the body, etc. can be used.

Figure 7A:
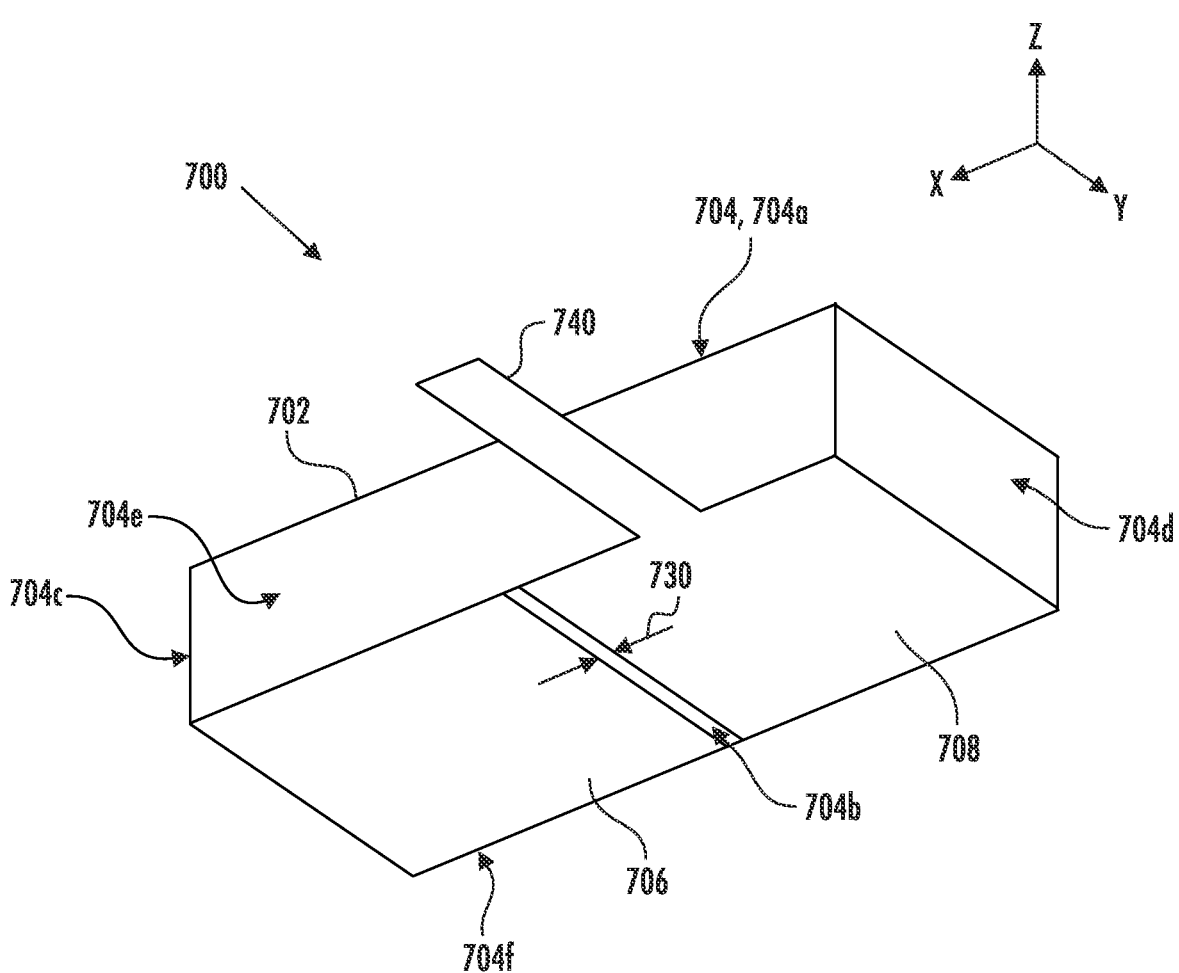
FIGS. 7A through 7F are views of example heat sink components having one or more flanges extending beyond a body of the respective heat sink component according to aspects of the present disclosure.
Figure 7B:
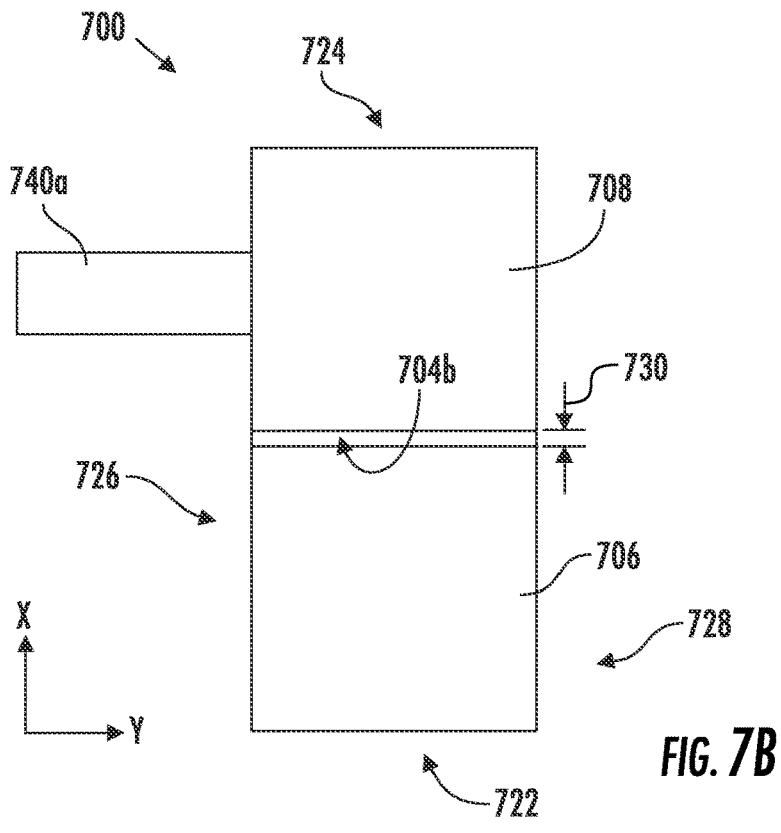
Figure 7C:
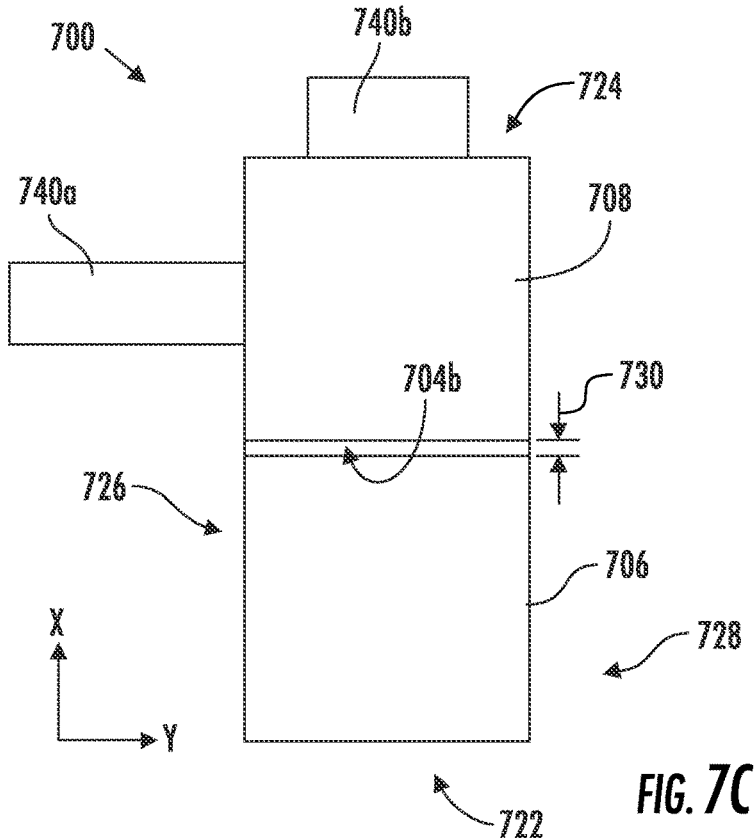
Figure 7D:
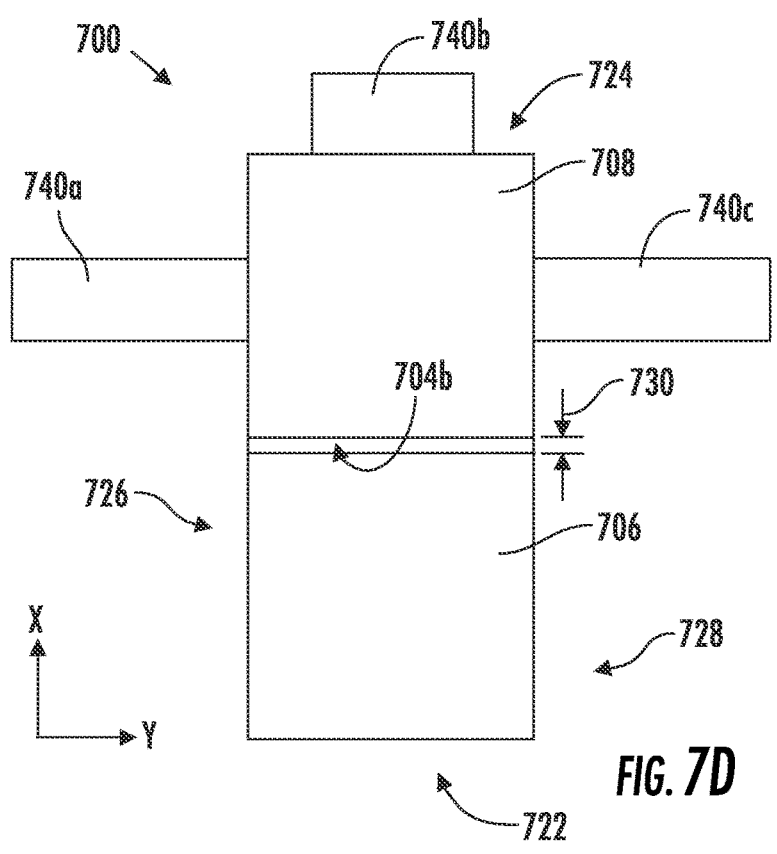
Figure 7E:
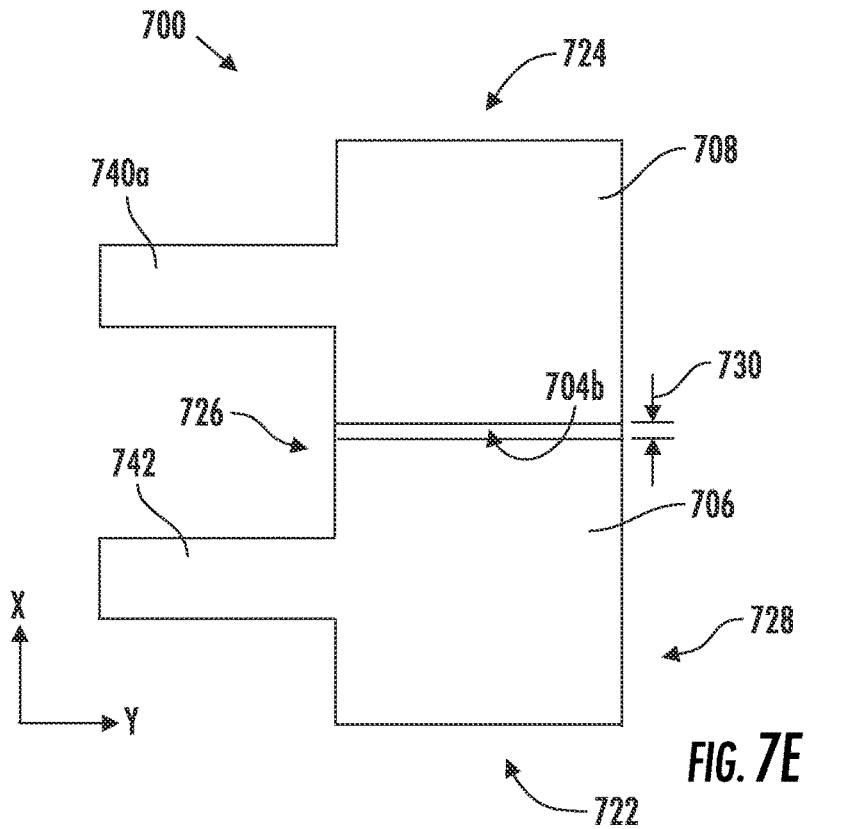

Referring to FIG. 7E, in some embodiments, the heat source terminal 706 can include at least one flange 742 extending outward beyond the body 702, which can be provided in addition to or without one or more flanges 740 extending from the heat sink terminal 708. For example, the heat source terminal 706 can be formed over the bottom surface 704b of the body 702 adjacent the first end 722 of the body 702. The heat source terminal 706 can include a flange 742 extending outward from the body 702 beyond one of the first side 726, the second side 728, or the first end 722, such as outward beyond the first side 726 as shown in FIG. 7E. As described with respect to the heat sink terminal 708 and the flange 740, in other embodiments, one or more flanges 742 may extend from the heat source terminal 706 outward beyond the body 702, with the one or more flanges 742 extending outward beyond different sides or ends of the body 702 than as shown in the illustrated embodiment.

Figure 7F:
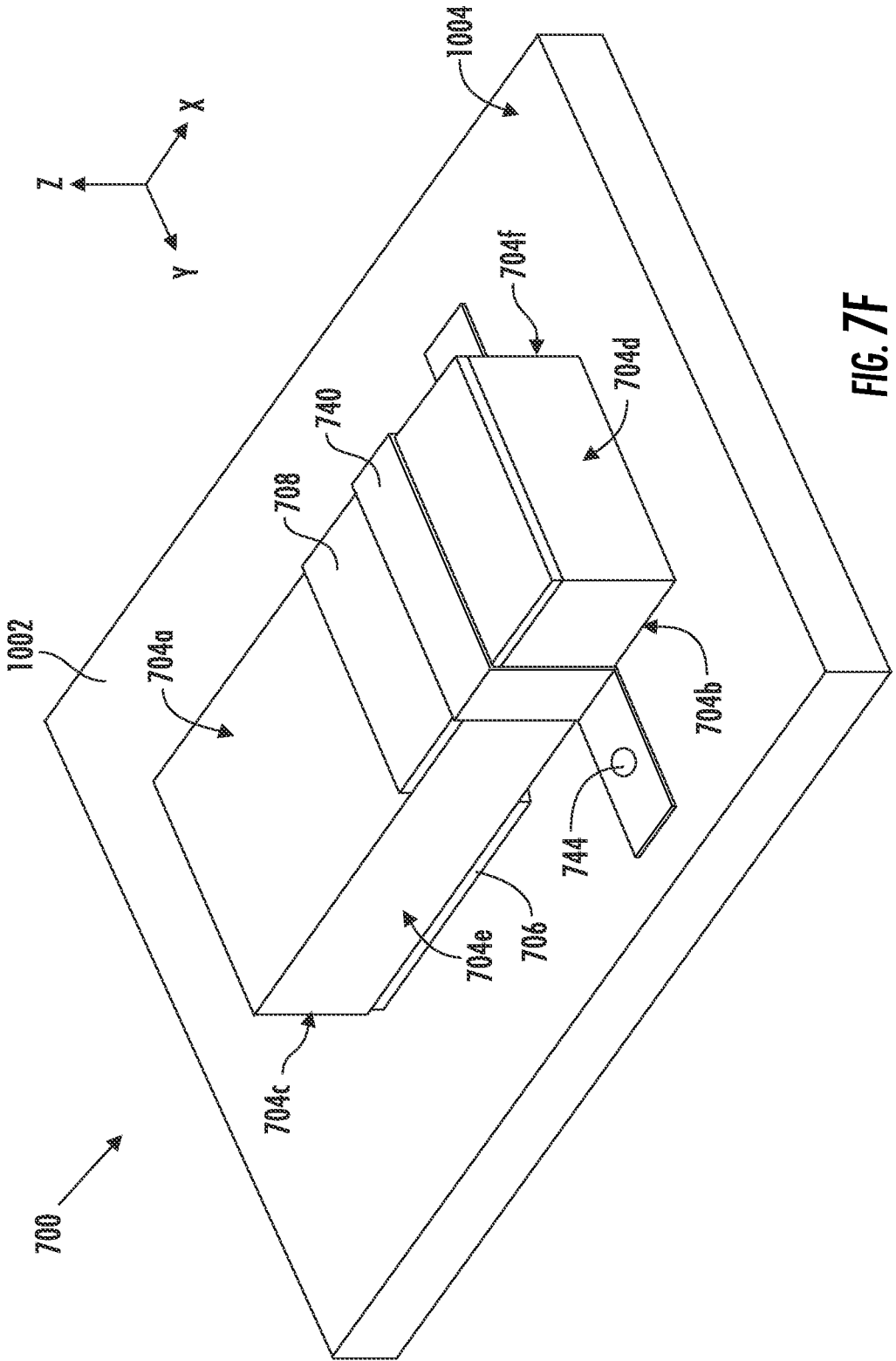

Referring to FIG. 7F, in some embodiments, the flange(s) 740, 742 may be configured to bend or otherwise deform to be positioned in contact with a device or mounting surface of a device (such as a circuit board or the like). For instance, the heat sink terminal 708 can be formed over the top surface 704a of the body 702 of the heat sink component 700 as depicted in FIG. 7F. The heat sink terminal 708 can include a flange 740 configured to bend downward toward the bottom surface 704b of the body 702 to contact, e.g., a heat sink of a device 1002 (such as described with respect to FIGS. 10A and 10B) to which the heat sink component 700 is mounted. For example, the flange 740 can be formed from a metal having properties (such as thickness, material properties, etc.) that allow the flange 740 to bend downward to the heat sink of the device 1002. The flange 740 can contact the heat sink of the device 1002, and in some embodiments may be secured to a top surface 1004 of the device 1002 using an appropriate fastener 744, such that heat conducted from the heat source terminal 706 through the body 702 to the flange 740 of the heat sink terminal 708 can be conducted away from the heat sink component 700 and into the heat sink of the device, thereby conducting heat away from the heat source in contact with the heat source terminal 706. The fastener 744 can be any suitable mechanical fastener or other type of fastener, such as a screw, an adhesive, solder, etc.

Further, as illustrated in FIGS. 7A and 7E, one or more of the flanges 740, 742 may be integrally formed with the respective terminal from which the flange 740, 742 extends. For example, as shown in the exemplary embodiments of FIGS. 7A and 7E, the flange 740 may be integrally formed with the heat sink terminal 708, and as shown in the exemplary embodiment of FIG. 7E, the flange 742 may be integrally formed with the heat source terminal 706. In other embodiments, one or more of the flanges 740, 742 may be joined to or otherwise coupled with the respective terminal from which the flange 740, 742 extends. For instance, as shown in FIGS. 7B-7D, the flanges 740a, 740b, 740c may be coupled with the heat sink terminal 708 in any appropriate manner such that the respective flange 740 extends from the heat sink terminal 708 away from the body 702 of the heat sink component 700.

As described herein, a heat sink component can be configured to mount to a device such as a circuit board, a multilayer ceramic component, or other suitable electric device. The heat sink component may have a variety of configurations and/or features for mounting to the device. In various embodiments, the heat source terminal can include at least one lead, can include at least one pair of ribbons or leads, can be configured for soldering to the device, and/or can include a pair of wire bond pads.

Figure 8A:
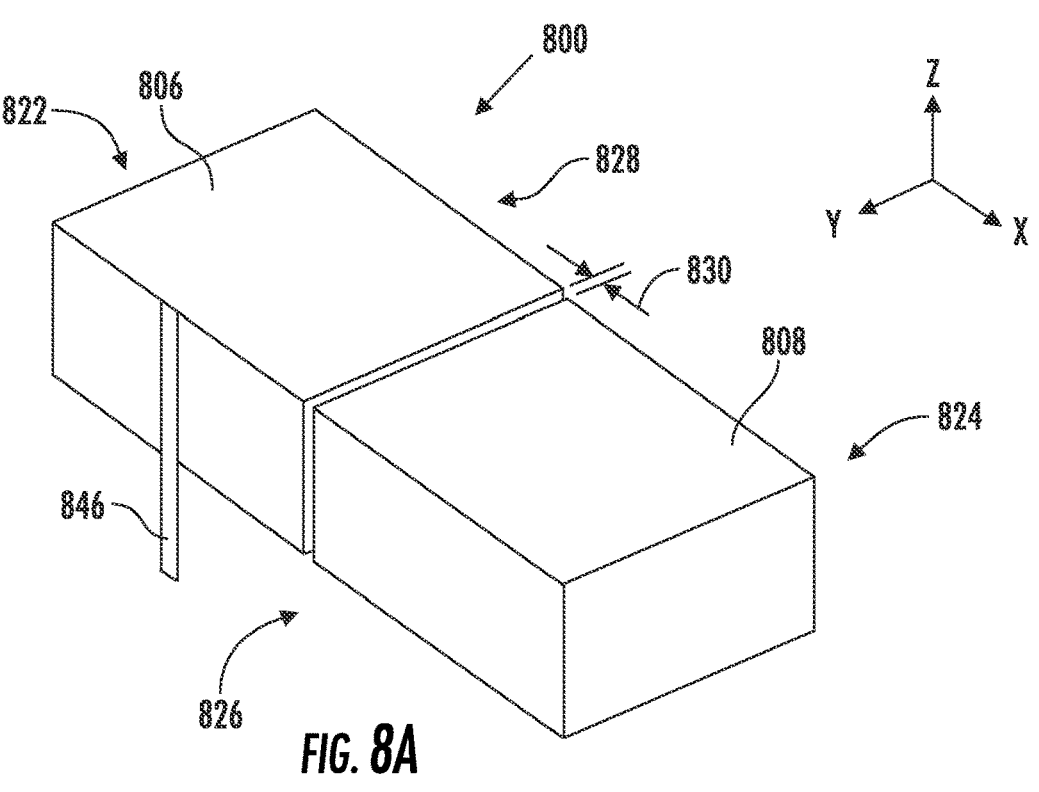
FIGS. 8A through 8C are perspective views of example heat sink components having at least one lead extending from a first terminal and/or a second terminal according to aspects of the present disclosure.
Figure 8B:
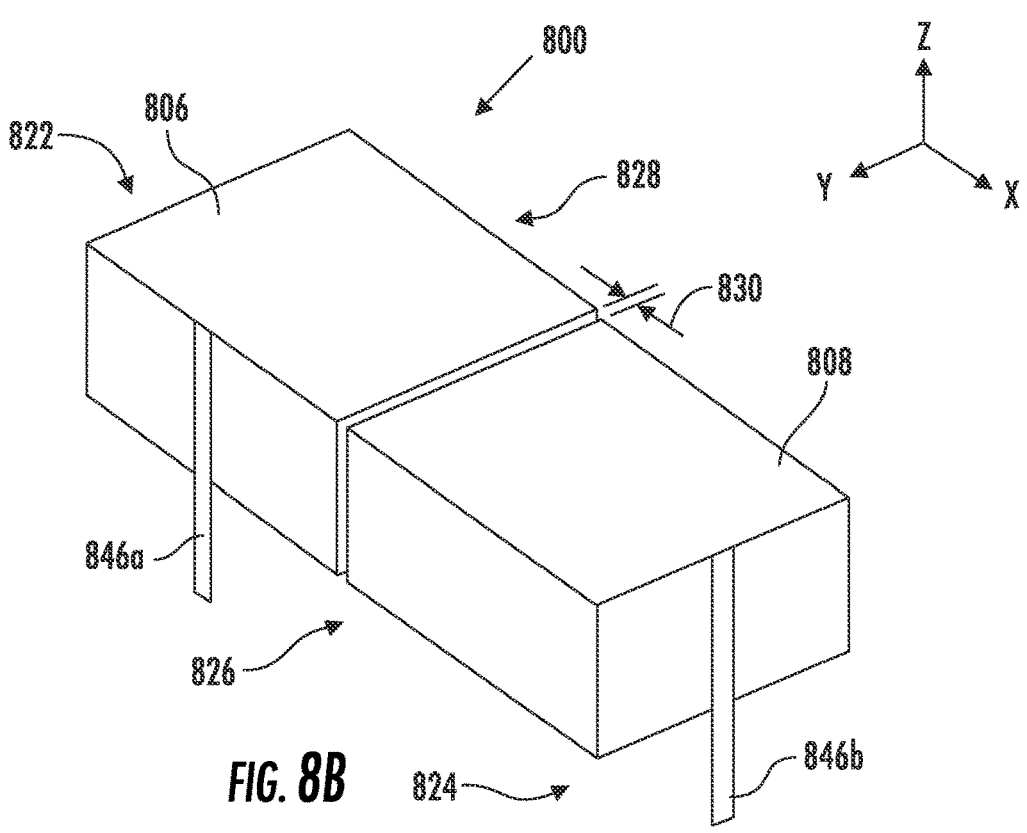
Figure 8C:
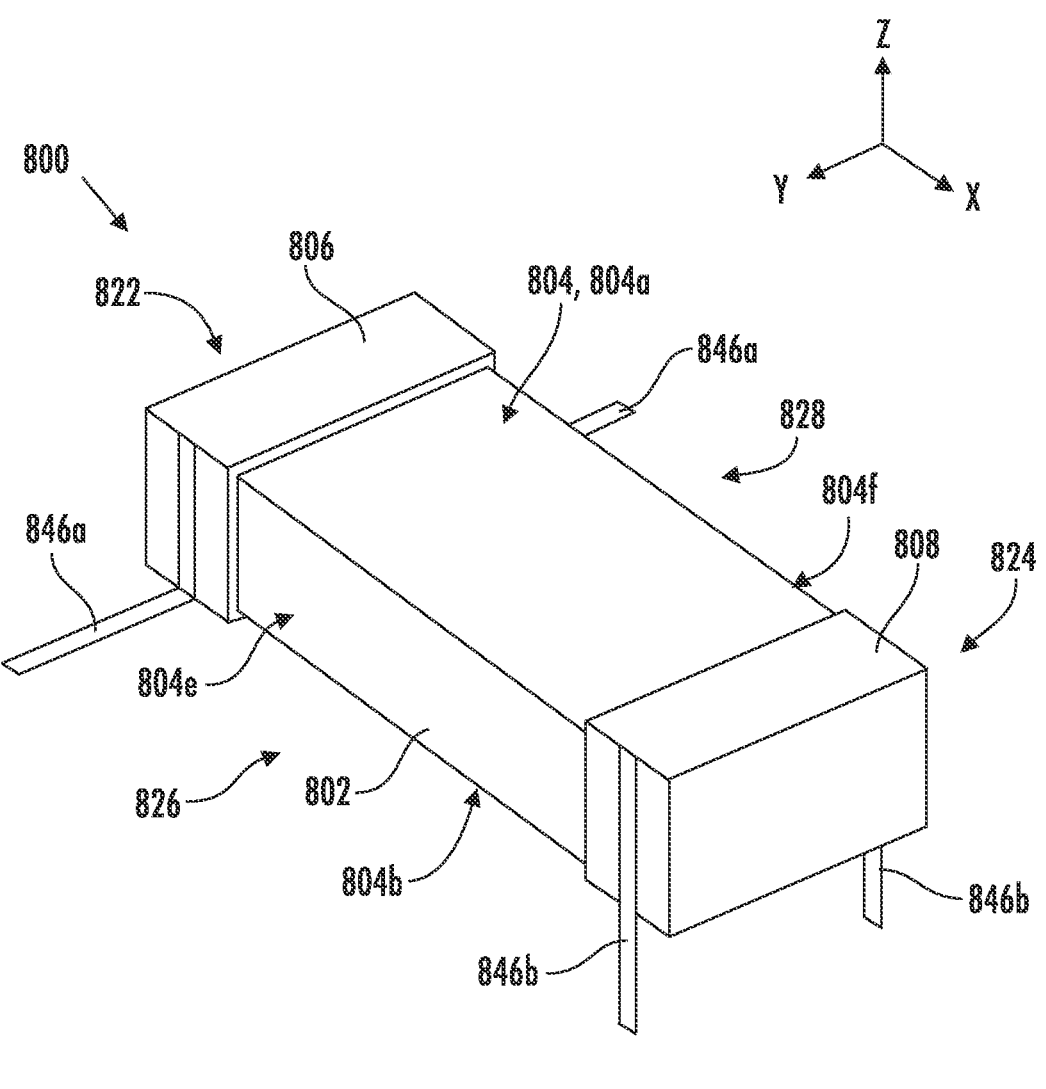

Turning now to FIGS. 8A through 8C, a heat sink component 800 can be generally configured similarly to the heat sink component 100 of FIGS. 1A and 1B. The heat sink component 800 can include one or more leads 846 extending from a heat source terminal 806, a heat sink terminal 808, or both. The heat source terminal 806 and the heat sink terminal 808 are each formed over one or more surfaces 804 (FIG. 8C) of a body 802 (FIG. 8C) of the heat sink component 800. The one or more leads 846 can facilitate attaching the heat sink component 800 to a device, e.g., to an existing component on a circuit board.

As shown in FIG. 8A, a lead 846 extends from the heat source terminal 806, e.g., to attach to a device. Referring to FIG. 8B, a first lead 846a extends from the heat source terminal 806 and a second lead 846b extends from the heat sink terminal 808. As illustrated in FIG. 8C, a first pair of leads 846a extends from the heat source terminal 806 and a second pair of leads 846b extends from the heat sink terminal 808.

In some embodiments, the one or more leads 846 can be flexible or bendable leads. For example, at least one pair of flexible or bendable leads 846 can extend from the heat source terminal 806 and/or the heat sink terminal 808. The flexible or bendable leads 846 can flex, bend, or otherwise deform to facilitate mounting the heat sink component on top of an existing component on a circuit board or the like.

Figure 9A:
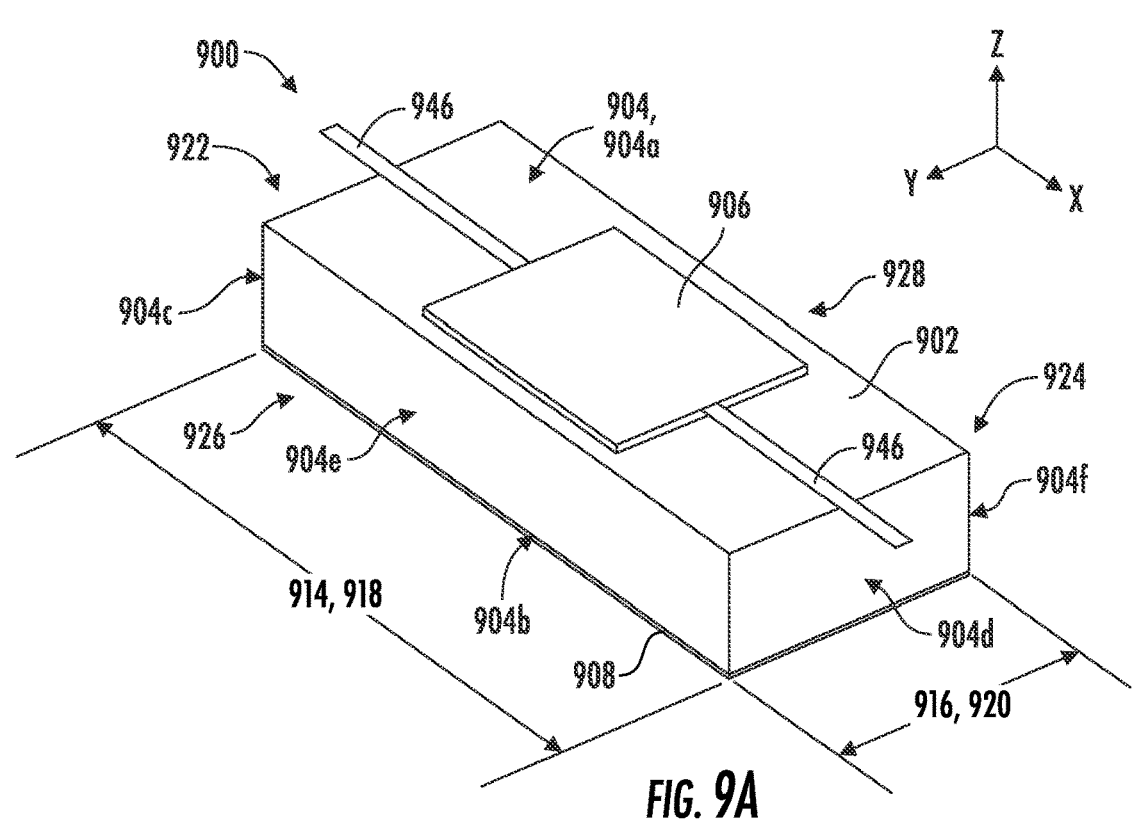
FIGS. 9A and 9B are perspective views of example heat sink components having a first terminal formed over a first surface and a second terminal formed over the entirety of a second surface opposite the first surface according to aspects of the present disclosure.
Figure 9B:
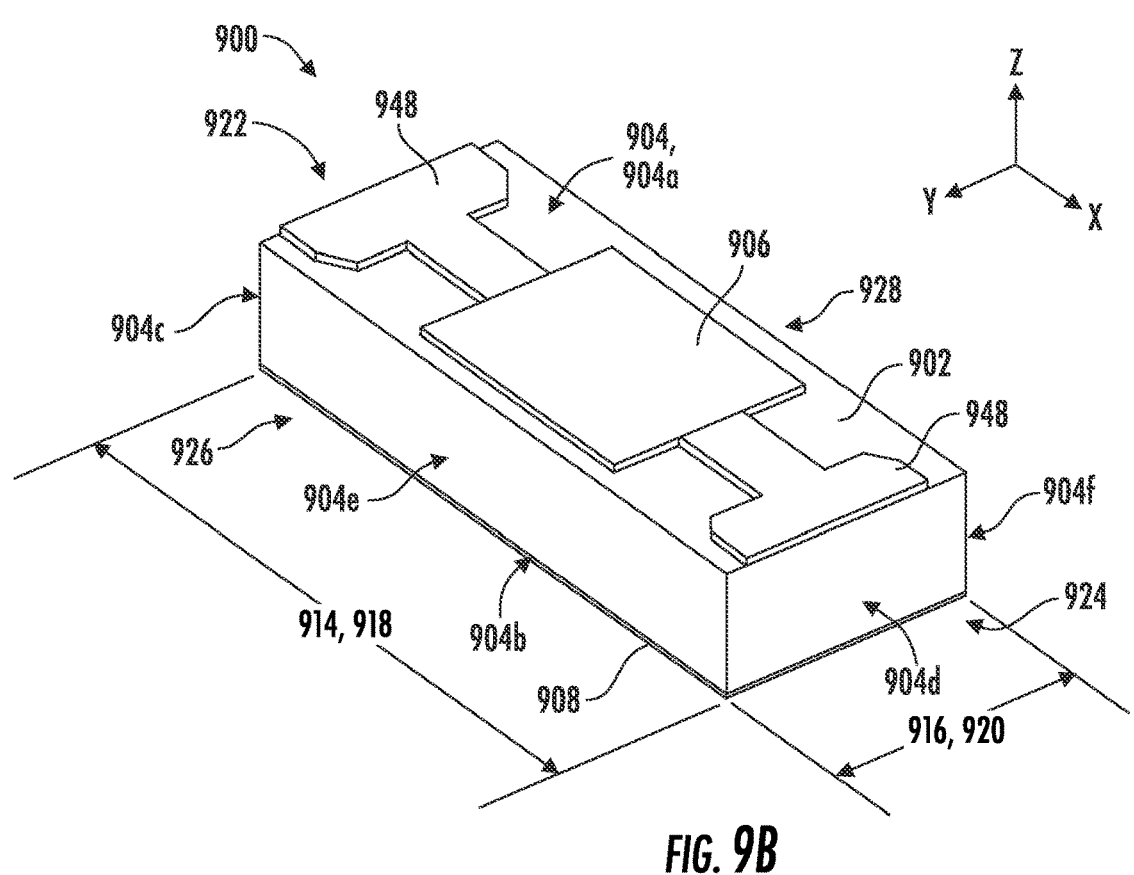

Referring to FIGS. 9A and 9B, a heat sink component 900 can be generally configured similarly to the heat sink component 100 of FIGS. 1A and 1B. The heat sink component 900 can include a body 902 and a heat sink terminal 908 formed over the entirety of a body surface 904 of the body 902. For example, the heat sink terminal 908 can be formed over the entirety of a bottom surface 904b of the body 902 such that the heat sink terminal 908 has a length 914 and a width 916 that are coextensive with a length 918 and a width 920 of the body 902 and bottom surface 904b. As such, the heat sink terminal 908 covers the entire bottom surface 904b and none of the bottom surface 904b is exposed.

The heat source terminal 906 can be formed over the body surface 904 opposite the body surface 904 entirely covered by the heat sink terminal 908. For example, as shown in FIGS. 9A and 9B, wherein the heat sink terminal 908 is formed over the bottom surface 904b, the heat source terminal 906 is formed on the top surface 904a, which is opposite the bottom surface 904b in the thickness direction Z. The heat source terminal 906 can include a pair of leads 946 or a pair of wire bond pads 948 for connecting to a device (e.g., a circuit board, a multilayer ceramic capacitor, or other electric component as described herein).

FIGS. 10A and 10B illustrate an embodiment of a component assembly 1000 according to aspects of the present disclosure. FIG. 10A illustrates a device 1002 to which the heat sink component 100 of FIGS. 1A and 1B can be mounted. FIG. 10B illustrates the heat sink component 100 mounted to the component assembly 1000 of FIG. 10A.

The component assembly 1000 can include a device 1002 comprising a top surface 1004 and a plurality of terminals exposed on the top surface 1004, such as one or more heat source terminals 1006 and one or more heat sink terminals 1008.

The heat sink component 100 can be mounted to the device 1002. The heat sink component 100 can generally be configured similarly to the heat sink component 100 of FIGS. 1A and 1B. As shown in FIG. 10B, the heat source terminal 106 of the heat sink component 100 is connected with the heat source terminal 1006 (outlined in dash-dot-dot-dash lines) of the device 1002, and the heat sink terminal 108 is connected with the heat sink terminal 1008 (outlined in dash-dot-dot-dash lines) of the device 1002.

The device 1002 can include a circuit board, a multilayer ceramic component, or other suitable electric device. The terminals 1006, 1008 of the device 1002 can be connected with embedded devices, electrodes, components (e.g., capacitors, resistors, inductors, etc.) within the device 1002.

Figure 11:
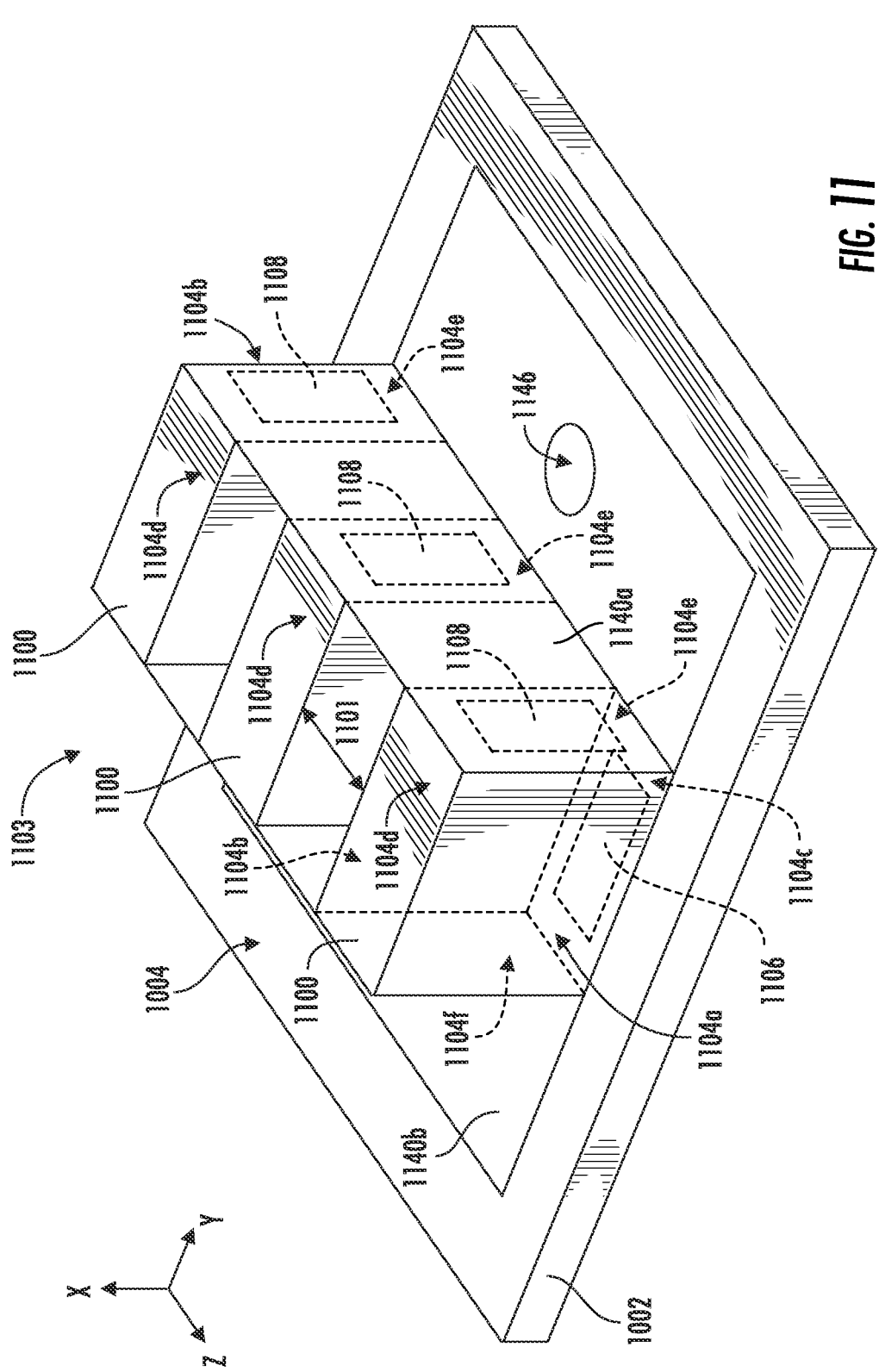
FIG. 11 illustrates an example heat sink component array according to aspects of the present disclosure.

Referring to FIG. 11, in some embodiments, multiple heat sink components 1100, such as two or more heat sink components 1100, may be joined together with one or more heat sink flanges 1140 and/or one or more heat source flanges (not shown). Each heat sink component 1100 can be generally configured similarly to the heat sink component 100 of FIGS. 1A and 1B. For example, each heat sink component 1100 can include a body 1102 and a plurality of body surfaces 1104, such as a top surface 1104a, a bottom surface 1104b, a first end surface 1104c, a second end surface 1104d, a first side surface 1104e, and a second side surface 1104f. A heat source terminal 1106 can be formed over at least a portion of at least one of the body surfaces 1104, and a heat sink terminal 1108 can be formed over at least a portion of at least one of the body surfaces 1104.

As shown in FIG. 11, three heat sink components 1100 may be joined together with a first heat sink flange 1140a and a second heat sink flange 1140b, each heat sink component 1100 having a first side surface 1104e in contact with the first heat sink flange 1140a and a second side surface 1104f in contact with the second heat sink flange 1140b. When joined together using the first heat sink flange 1140a and the second heat sink flange 1140b, the multiple heat sink components 1100 may be referred to as a heat sink component array 1103.

As further illustrated in FIG. 11, the heat sink components 1100 are mounted in a spaced, vertical orientation, with the multiple heat sink components 1100 spaced apart from one another by a component spacing distance 1101. The component spacing distance 1101 can allow air to move between the heat sink components 1100 joined together by the flanges 1140. In other embodiments, a single heat sink component, such as a heat sink component 100, may be mounted to a heat sink of a device such as device 1002 (e.g., as described with respect to FIGS. 10A and 10B) in a vertical orientation as shown in FIG. 11.

It will be appreciated that two heat sink flanges 1140 disposed on opposite sides of the heat sink component array 1103 as shown in FIG. 11 is by way of example only. For instance, in some embodiments, only one heat sink flange 1140, extending along one side of the heat sink component array 1103 may be provided. In other embodiments, two or more heat sink flanges 1140 may be provided on the same side of the heat sink component array 1103. In still other embodiments, two or more heat sink flanges 1140 may be provided with the heat sink component array 1103, with at least one heat sink flange 1140 provided on a different side of the heat sink component array 1103 than another heat sink flange 1140.

The heat sink flanges 1140, and when provided, the heat source flanges, may be configured similarly to the flanges 740, 742 described herein. For example, while the heat sink flanges 1140 are in contact with one or more heat sink terminals 1108 of one or more heat sink components 1100, each heat source flange may be in contact with one or more heat source terminals 1106 of the one or more heat sink components 1100. Like the flanges 742 described with respect to FIG. 7E, the heat source flanges can be configured to conduct heat from a heat source to the heat sink components 1100, e.g., to cool the heat source by conducting heat away from the heat source via the heat sink components 1100.

Further, the heat sink flange(s) 1140 and/or heat source flanges may be configured to bend or otherwise deform to be positioned in contact with a device or mounting surface of a device (such as a circuit board or the like). For instance, a heat sink terminal 1108 can be formed over the first side surface 1104e of the body 1102 of each heat sink component 1100 as depicted in FIG. 11. The first heat sink flange 1140a, in contact with the heat sink terminal 1108 on the first side surface 1104e of each heat sink component 1100, may be configured to bend outward or away from the heat sink components 1100, e.g., generally parallel to the top surface 1104a and bottom surface 1104b of the body 1102 of each heat sink component 1100 to contact, e.g., a heat sink of a device 1002 (such as described with respect to FIGS. 10A and 10B) to which the heat sink components 1100 are mounted. Similarly, a heat sink terminal 1108 can be formed over the second side surface 1104f of the body 1102 of each heat sink component 1100 as depicted in FIG. 11. The second heat sink flange 1140b, in contact with the heat sink terminal 1108 on the second side surface 1104f of each heat sink component 1100, may be configured to bend outward or away from the heat sink components 1100, e.g., generally parallel to the top surface 1104a and bottom surface 1104b of the body 1102 of each heat sink component 1100 to contact, e.g., a heat sink of a device 1002 (such as described with respect to FIGS. 10A and 10B) to which the heat sink components 1100 are mounted.

The heat sink flanges 1140 can be formed from a metal having properties (such as thickness, material properties, etc.) that allow the heat sink flange 1140 to bend outward to the heat sink of the device 1002. The heat sink flanges 1140 can contact the heat sink of the device 1002, and in some embodiments may be secured to a top surface 1004 of the device 1002 using an appropriate fastener (not shown), such that heat conducted from the heat source terminal 1106 through the body 1102 of each heat sink component 1100 to the heat sink flange(s) 1140 in contact with the heat sink terminal(s) 1108 can be conducted away from the heat sink components 1100 and into the heat sink of the device, thereby conducting heat away from the heat source in contact with the heat source terminals 1106. The fastener can be any suitable mechanical fastener or other type of fastener, such as a screw, an adhesive, solder, etc. For example, the fastener may be a screw or the like extending through an aperture 1146 in the respective heat sink flange 1140.

Figure 12:
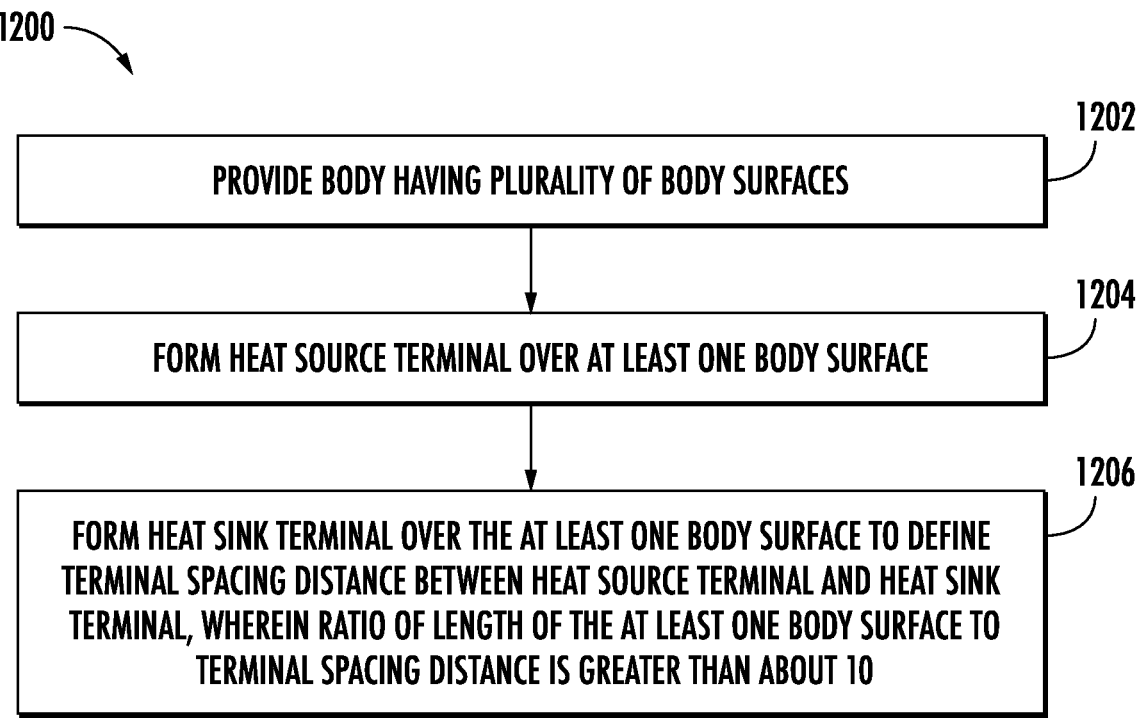

FIG. 12 is a flowchart of a method 1200 of manufacturing a heat sink component according to aspects of the present disclosure. In general, the method 1200 will be described herein with reference to the heat sink components 100, 200, 300, 400, 500, 600, 700, 800, 900, 1100 of FIGS. 1A through 11. However, it should be appreciated that the disclosed method 1200 may be implemented with any suitable heat sink component. In addition, although FIG. 12 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1202, providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1204, forming a heat source terminal over at least one body surface of the plurality of body surfaces.

The method can include, at 1206, forming a heat sink terminal over the at least one body surface of the plurality of body surfaces to define a terminal spacing distance along the at least one body surface between the heat source terminal and the heat sink terminal.

A ratio of a length of the at least one body surface to the terminal spacing distance can be greater than about 10.

Figure 13:
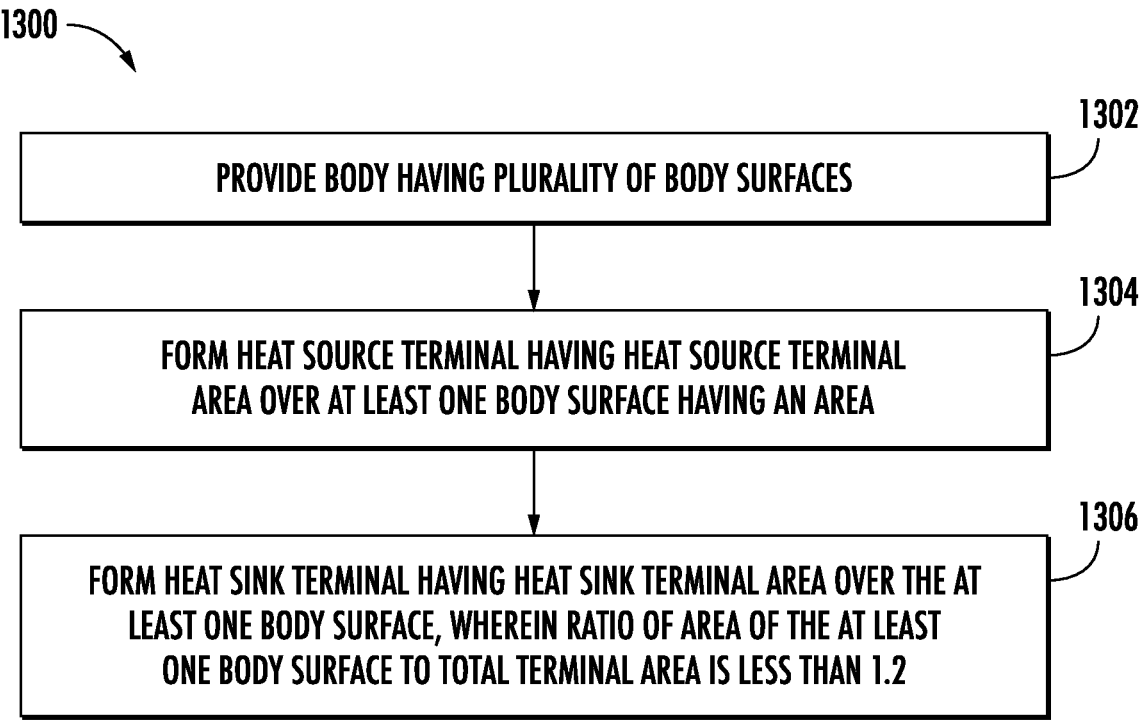

FIG. 13 is a flowchart of a method 1300 of manufacturing a heat sink component according to aspects of the present disclosure. In general, the method 1300 will be described herein with reference to the heat sink components 100, 200, 300, 400, 500, 600, 700, 800, 900, 1100 of FIGS. 1A through 11. However, it should be appreciated that the disclosed method 1300 may be implemented with any suitable heat sink component. In addition, although FIG. 13 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1302, providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1304, forming a heat source terminal over at least one body surface of the plurality of body surfaces.

The method can include, at 1306, forming a heat sink terminal over the at least one body surface of the plurality of body surfaces.

The at least one body surface can have an area defined by a product of a length of the at least one body surface and a width of the at least one body surface. The heat source terminal can have a heat source terminal area defined by a product of a heat source terminal length and a heat source terminal width. The heat sink terminal can have a heat sink terminal area defined by a product of a heat sink terminal length and a heat sink terminal width. A sum of the heat source terminal area and the heat sink terminal area can be a total terminal area. A ratio of the area of the at least one body surface to the total terminal area can be less than 1.2.

FIG. 14 is a flowchart of a method 1400 of manufacturing a heat sink component according to aspects of the present disclosure. In general, the method 1400 will be described herein with reference to the heat sink components 100, 200, 300, 400, 500, 600, 700, 800, 900, 1100 of FIGS. 1A through 11. However, it should be appreciated that the disclosed method 1400 may be implemented with any suitable heat sink component. In addition, although FIG. 14 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1402, providing a body comprising a thermally conductive material that is electrically non-conductive. The body can define a longitudinal direction, a lateral direction, and a thickness direction that are orthogonal to one another. The body can have a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1404, forming a heat source terminal over at least one body surface of the plurality of body surfaces.

The method can include, at 1406, forming a heat sink terminal over the at least one body surface of the plurality of body surfaces to define a terminal spacing distance along the at least one body surface between the heat source terminal and the heat sink terminal.

The terminal spacing distance can be offset from a lateral centerline axis extending along the lateral direction or a longitudinal centerline axis extending along the longitudinal direction.

Figure 15:
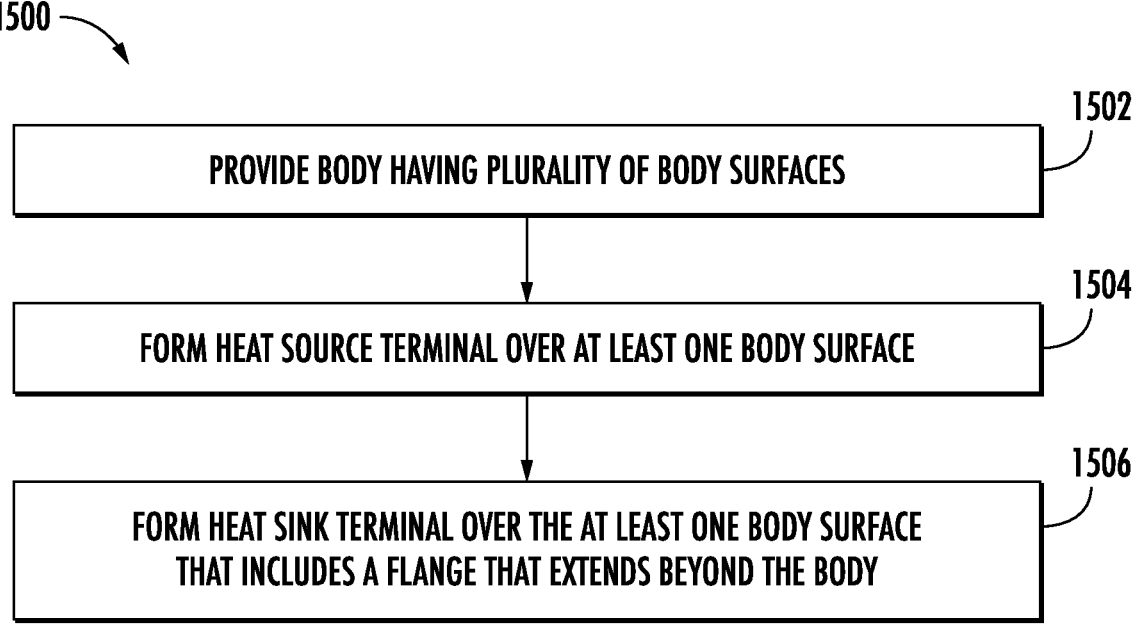

FIG. 15 is a flowchart of a method 1500 of manufacturing a heat sink component according to aspects of the present disclosure. In general, the method 1500 will be described herein with reference to the heat sink components 100, 200, 300, 400, 500, 600, 700, 800, 900, 1100 of FIGS. 1A through 11. However, it should be appreciated that the disclosed method 1500 may be implemented with any suitable heat sink component. In addition, although FIG. 15 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1502, providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1504, forming a heat source terminal over at least one of the top surface, the bottom surface, the first end surface, the second end surface, the first side surface, or the second side surface.

The method can include, at 1506, forming a heat sink terminal over the at least one of the top surface, the bottom surface, the first end surface, the second end surface, the first side surface, or the second side surface.

The heat sink terminal can include a flange that extends beyond the body.

Figure 16:
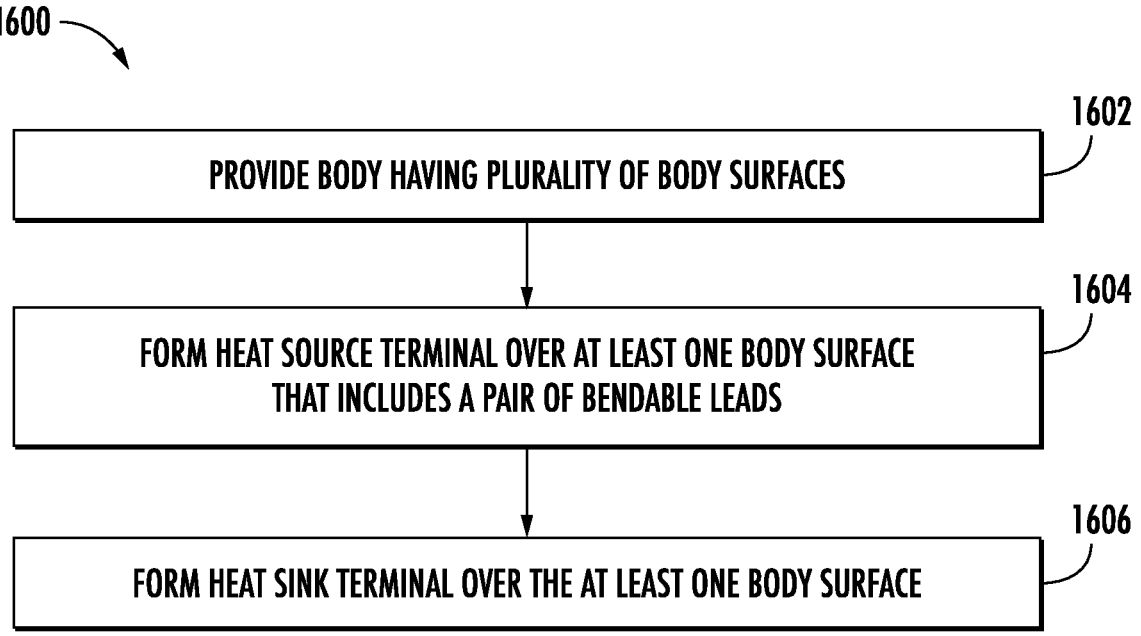

FIG. 16 is a flowchart of a method 1600 of manufacturing a heat sink component according to aspects of the present disclosure. In general, the method 1600 will be described herein with reference to the heat sink components 100, 200, 300, 400, 500, 600, 700, 800, 900, 1100 of FIGS. 1A through 11. However, it should be appreciated that the disclosed method 1600 may be implemented with any suitable heat sink component. In addition, although FIG. 16 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1602, providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1604, forming a heat source terminal over at least one of the top surface, the bottom surface, the first end surface, the second end surface, the first side surface, or the second side surface.

The method can include, at 1606, forming a heat sink terminal over the at least one of the top surface, the bottom surface, the first end surface, the second end surface, the first side surface, or the second side surface.

The heat source terminal can include a pair of bendable leads.

Figure 17:
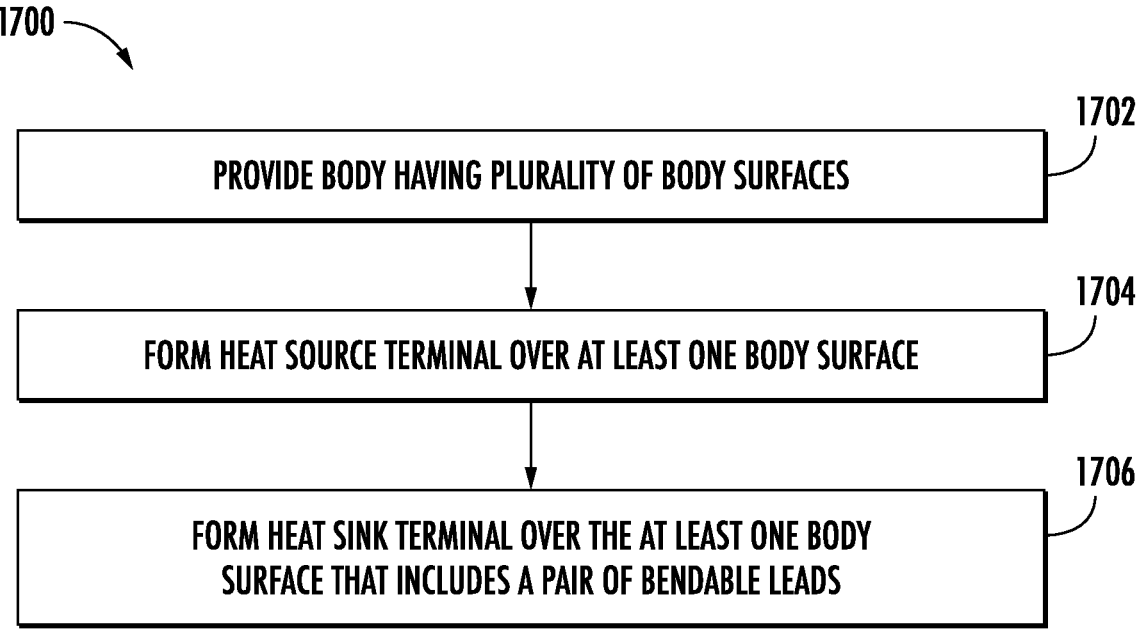

FIG. 17 is a flowchart of a method 1700 of manufacturing a heat sink component according to aspects of the present disclosure. In general, the method 1700 will be described herein with reference to the heat sink components 100, 200, 300, 400, 500, 600, 700, 800, 900, 1100 of FIGS. 1A through 11. However, it should be appreciated that the disclosed method 1700 may be implemented with any suitable heat sink component. In addition, although FIG. 17 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1702, providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1704, forming a heat source terminal over at least one of the top surface, the bottom surface, the first end surface, the second end surface, the first side surface, or the second side surface.

The method can include, at 1706, forming a heat sink terminal over the at least one of the top surface, the bottom surface, the first end surface, the second end surface, the first side surface, or the second side surface.

The heat sink terminal can include a pair of bendable leads.

Figure 18:
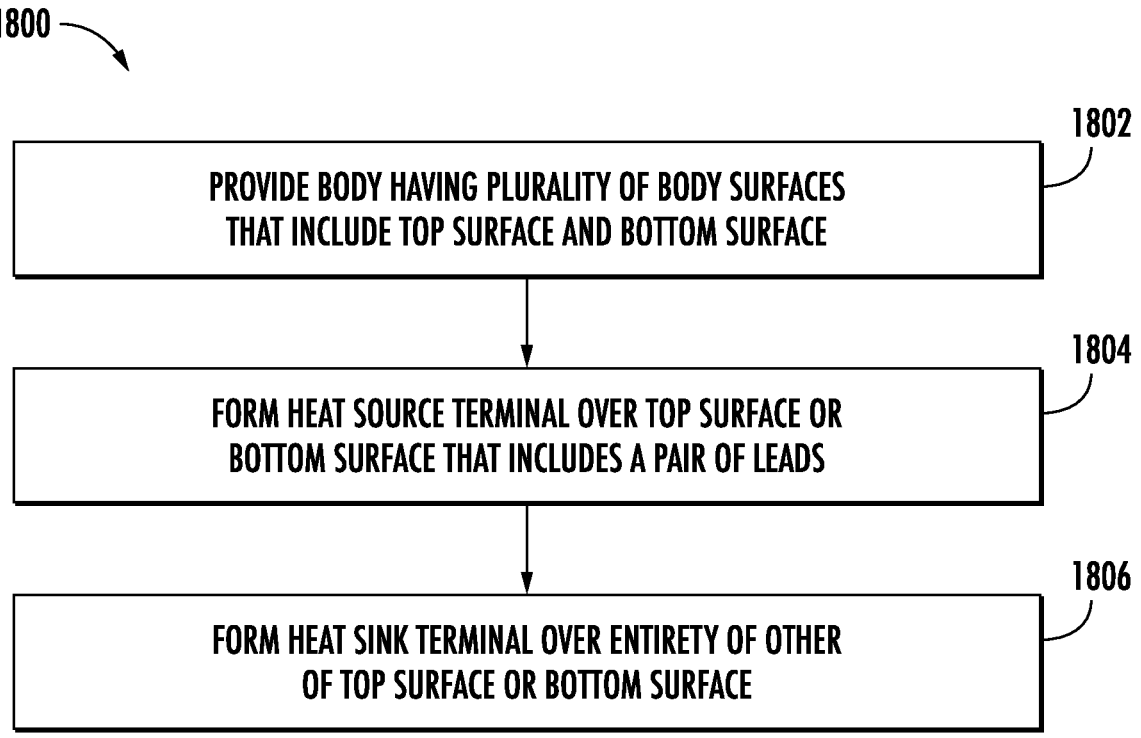

FIG. 18 is a flowchart of a method 1800 of manufacturing a heat sink component according to aspects of the present disclosure. In general, the method 1800 will be described herein with reference to the heat sink components 100, 200, 300, 400, 500, 600, 700, 800, 900, 1100 of FIGS. 1A through 11. However, it should be appreciated that the disclosed method 1800 may be implemented with any suitable heat sink component. In addition, although FIG. 18 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1802, providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1804, forming a heat source terminal over the top surface or the bottom surface.

The method can include, at 1806, forming a heat sink terminal over the entirety of the other of the top surface or the bottom surface.

The heat source terminal can include a pair of leads.

Figure 19:
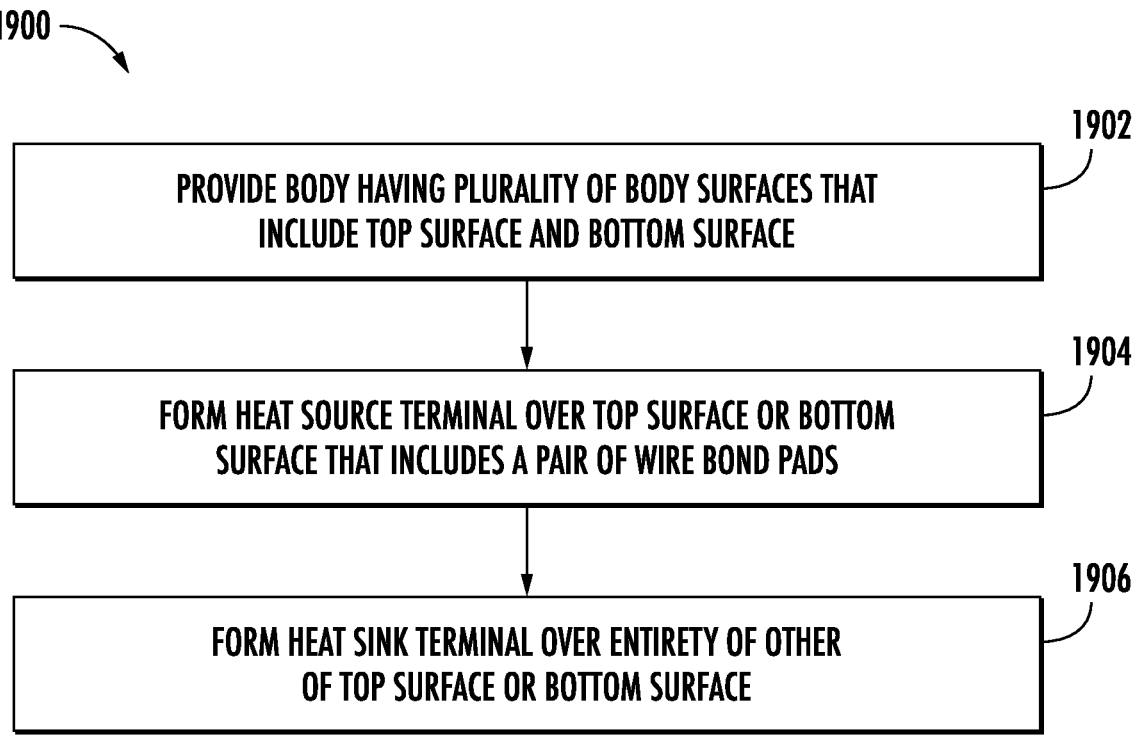

FIG. 19 is a flowchart of a method 1900 of manufacturing a heat sink component according to aspects of the present disclosure. In general, the method 1900 will be described herein with reference to the heat sink components 100, 200, 300, 400, 500, 600, 700, 800, 900, 1100 of FIGS. 1A through 11. However, it should be appreciated that the disclosed method 1900 may be implemented with any suitable heat sink component. In addition, although FIG. 19 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 1902, providing a body comprising a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 1904, forming a heat source terminal over the top surface or the bottom surface.

The method can include, at 1906, forming a heat sink terminal over the entirety of the other of the top surface or the bottom surface.

The heat source terminal can include a pair of wire bond pads.

Figure 20:
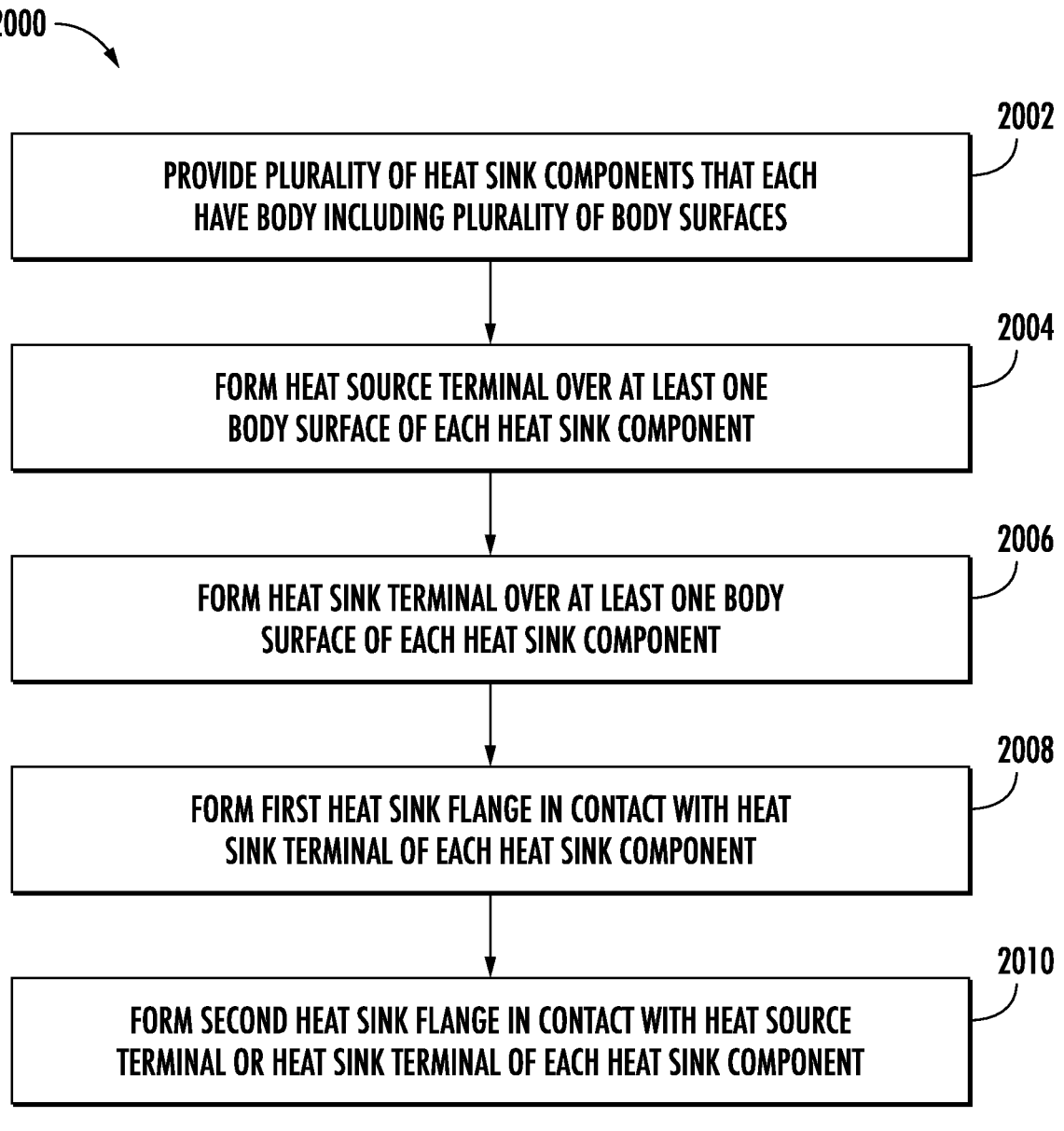
FIG. 20 is a flowchart of a method of manufacturing a heat sink component array according to aspects of the present disclosure.

FIG. 20 is a flowchart of a method 2000 of manufacturing a heat sink component array according to aspects of the present disclosure. In general, the method 2000 will be described herein with reference to the heat sink components 100, 200, 300, 400, 500, 600, 700, 800, 900, 1100 of FIGS. 1A through 11. However, it should be appreciated that the disclosed method 2000 may be implemented with any suitable heat sink component. In addition, although FIG. 20 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 2002, providing a plurality of heat sink components, each heat sink components having a body including a thermally conductive material that is electrically non-conductive. The body can define a longitudinal direction, a lateral direction, and a thickness direction that are orthogonal to one another. The body can have a top surface, a bottom surface opposite the top surface along the thickness direction, a first end surface, a second end surface opposite the first end surface along the longitudinal direction, a first side surface, and a second side surface opposite the first side surface along the lateral direction.

The method can include, at 2004, forming a heat source terminal over at least one of the top surface, the bottom surface, the first end surface, the second end surface, the first side surface, or the second side surface of the body of each heat sink component of the plurality of heat sink components.

The method can include, at 2006, forming a heat sink terminal over at least one of the top surface, the bottom surface, the first end surface, the second end surface, the first side surface, or the second side surface of the body of each heat sink component of the plurality of heat sink components.

The method can include, at 2008, forming a heat sink flange in contact with the heat sink terminal of each heat sink component of the plurality of heat sink components.

Optionally, as shown at 2010, the method 2000 can include forming a second heat sink flange in contact with a heat source terminal or a heat sink terminal of each heat sink component of the plurality of heat sink components.

The heat sink flange can join together the plurality of heat sink components, which may spaced apart from one another by a component spacing distance.

Applications

The various embodiments of heat sink components disclosed herein may have a variety of applications.

Example applications include power handling systems and monolithic microwave integrated circuit (MMIC). The heat sink component may facilitate heat flow from terminals of the device that are connected to the heat source terminals of the heat sink device. As examples, various embodiments suitable electrical components can be connected with the terminals of the heat sink component. As examples, the device can include a circuit board (e.g., with embedded components), power amplifier, filter, synthesizer, computer component, power supply, and/or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes.

These and other modifications and variations of the present invention may be practiced by those of ordinary skill in the art, without departing from the scope of the present invention. In addition, it should be understood that aspects of the various embodiments may be interchanged both in whole or in part. Further, those of ordinary skill in the art will appreciate that the foregoing description is by way of example only and is not intended to limit the invention so further described in such appended claims.

What is claimed is:

1. A heat sink component, comprising:
a body comprising a thermally conductive material that is electrically non-conductive, the body defining a longitudinal direction, a lateral direction, and a thickness direction that are orthogonal to one another, the body having a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction;
a heat source terminal formed over at least one body surface of the plurality of body surfaces; and
a heat sink terminal formed over the at least one body surface of the plurality of body surfaces,
wherein the heat source terminal and the heat sink terminal are formed over the at least one body surface such that the at least one body surface is symmetrical about both a longitudinal centerline axis extending in the longitudinal direction and a lateral centerline axis extending in the lateral direction,
wherein a terminal spacing distance is defined along the at least one body surface between the heat source terminal and the heat sink terminal, and
wherein a ratio of a length of the at least one body surface to the terminal spacing distance is greater than about 10.

2. The heat sink component of claim 1, wherein the at least one body surface has an area defined by a product of the length of the at least one body surface and a width of the at least one body surface,
wherein the heat source terminal has a heat source terminal area defined by a product of a heat source terminal length and a heat source terminal width,
wherein the heat sink terminal has a heat sink terminal area defined by a product of a heat sink terminal length and a heat sink terminal width,
wherein a sum of the heat source terminal area and the heat sink terminal area is a total terminal area, and
wherein a ratio of the area of the at least one body surface to the total terminal area is less than 1.2.

3. The heat sink component of claim 1, wherein the at least one body surface is the bottom surface.

4. The heat sink component of claim 1, wherein the at least one body surface is the top surface.

5. The heat sink component of claim 1, wherein the body has a first end spaced apart from a second end along the longitudinal direction,
wherein the heat source terminal wraps around the first end such that the heat source terminal is formed over at least the top surface, the bottom surface, and the first end surface, and
wherein the heat sink terminal wraps around the second end such that the heat sink terminal is formed over at least the top surface, the bottom surface, and the second end surface.

6. The heat sink component of claim 1, wherein the at least one body surface is the bottom surface, wherein the heat source terminal is spaced apart from each of the first end surface, the second end surface, the first side surface, and the second side surface, and further comprising:
one or more additional heat source terminals formed over the bottom surface, each additional heat source terminal of the one or more additional heat source terminals spaced apart from the first end surface, the second end surface, the first side surface, and the second side surface.

7. The heat sink component of claim 1, wherein the terminal spacing distance is defined in the longitudinal direction.

8. The heat sink component of claim 1, wherein the terminal spacing distance is defined in the lateral direction.

9. The heat sink component of claim 1, wherein the lateral centerline axis bisects the terminal spacing distance.

10. The heat sink component of claim 1, wherein the longitudinal centerline axis bisects the terminal spacing distance.

11. The heat sink component of claim 1, wherein the at least one body surface is the bottom surface, wherein the heat sink terminal is disposed adjacent the second end surface, and wherein the heat sink terminal comprises a first flange extending beyond one of the first side surface, the second side surface, or the second end surface.

12. The heat sink component of claim 11, wherein the heat sink terminal comprises a second flange extending beyond another of the first side surface, the second side surface, or the second end surface.

13. The heat sink component of claim 12, wherein the heat sink terminal comprises a third flange extending beyond the remaining one of the first side surface, the second side surface, or the second end surface.

14. The heat sink component of claim 1, wherein the heat source terminal comprises at least one flange.

15. The heat sink component of claim 1, wherein the heat source terminal comprises at least one pair of leads.

16. The heat sink component of claim 1, further comprising at least one pair of bendable leads extending from at least one of the heat source terminal or the heat sink terminal.

17. The heat sink component of claim 1, wherein the heat sink component comprises a material having a thermal conductivity from about 150 W/m·° C. to about 300 W/m·° C. at about 22° C.

18. A heat sink component, comprising:
a body comprising a thermally conductive material that is electrically non-conductive, the body defining a longitudinal direction, a lateral direction, and a thickness direction that are orthogonal to one another, the body having a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction;

a heat source terminal formed over at least one body surface of the plurality of body surfaces; and a heat sink terminal formed over the at least one body surface of the plurality of body surfaces, wherein the heat sink component comprises a material having a thermal conductivity from about 150 W/m·° C. to about 300 W/m·° C. at about 22° C., wherein a terminal spacing distance is defined along the at least one body surface between the heat source terminal and the heat sink terminal, and wherein a ratio of a length of the at least one body surface to the terminal spacing distance is greater than about 10.

19. The heat sink component of claim 18, wherein the terminal spacing distance is offset from a lateral centerline axis extending in the lateral direction.

20. The heat sink component of claim 18, wherein the terminal spacing distance is offset from a longitudinal centerline axis extending in the longitudinal direction.

21. The heat sink component of claim 18, wherein the at least one body surface has an area defined by a product of a length of the at least one body surface and a width of the at least one body surface, wherein the heat source terminal has a heat source terminal area defined by a product of a heat source terminal length and a heat source terminal width, wherein the heat sink terminal has a heat sink terminal area defined by a product of a heat sink terminal length and a heat sink terminal width, wherein a sum of the heat source terminal area and the heat sink terminal area is a total terminal area, and wherein a ratio of the area of the at least one body surface to the total terminal area is less than 1.2.

22. The heat sink component of claim 18, wherein the heat sink component is incorporated into a component assembly comprising a device comprising a top surface and a plurality of terminals exposed on the top surface, wherein the heat source terminal is connected with one of the plurality of terminals of the device, and the heat sink terminal is connected with another of the plurality of terminals of the device.

23. A heat sink component, comprising:

a body comprising a thermally conductive material that is electrically non-conductive, the body defining a longitudinal direction, a lateral direction, and a thickness direction that are orthogonal to one another, the body having a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction;

a heat source terminal formed over at least one body surface of the plurality of body surfaces; and a heat sink terminal formed over the at least one body surface of the plurality of body surfaces, wherein the body has a first end spaced apart from a second end along the longitudinal direction, wherein the heat source terminal wraps around the first end such that the heat source terminal is formed over at least the top surface, the bottom surface, and the first end surface, wherein the heat sink terminal wraps around the second end such that the heat sink terminal is formed over at least the top surface, the bottom surface, and the second end surface, wherein a terminal spacing distance is defined along the at least one body surface between the heat source terminal and the heat sink terminal, and wherein a ratio of a length of the at least one body surface to the terminal spacing distance is greater than about 10.

24. A heat sink component, comprising:

a body comprising a thermally conductive material that is electrically non-conductive, the body defining a longitudinal direction, a lateral direction, and a thickness direction that are orthogonal to one another, the body having a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction;

a heat source terminal formed over at least one body surface of the plurality of body surfaces; and a heat sink terminal formed over the at least one body surface of the plurality of body surfaces, wherein the at least one body surface is the bottom surface, the heat sink terminal is disposed adjacent the second end surface, and the heat sink terminal comprises a first flange extending beyond one of the first side surface, the second side surface, or the second end surface, wherein a terminal spacing distance is defined along the at least one body surface between the heat source terminal and the heat sink terminal, and wherein a ratio of a length of the at least one body surface to the terminal spacing distance is greater than about 10.

25. A heat sink component, comprising:

a body comprising a thermally conductive material that is electrically non-conductive, the body defining a longitudinal direction, a lateral direction, and a thickness direction that are orthogonal to one another, the body having a plurality of body surfaces including a top surface, a bottom surface opposite the top surface along the thickness direction, a first end surface, a second end surface opposite the first end surface along the longitudinal direction, a first side surface, and a second side surface opposite the first side surface along the lateral direction;

a heat source terminal formed over at least one body surface of the plurality of body surfaces;

a heat sink terminal formed over the at least one body surface of the plurality of body surfaces; and at least one pair of bendable leads extending from at least one of the heat source terminal or the heat sink terminal, wherein a terminal spacing distance is defined along the at least one body surface between the heat source terminal and the heat sink terminal, and wherein a ratio of a length of the at least one body surface to the terminal spacing distance is greater than about 10.

\* \* \* \* \*